United States Patent
Arishima

(10) Patent No.: US 12,137,291 B2
(45) Date of Patent: Nov. 5, 2024

(54) PHOTOELECTRIC CONVERSION APPARATUS HAVING PAD ARRANGEMENT

(71) Applicant: CANON KABUSHIKI KAISHA, Tokyo (JP)

(72) Inventor: Yu Arishima, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 280 days.

(21) Appl. No.: 17/587,891

(22) Filed: Jan. 28, 2022

(65) Prior Publication Data

US 2022/0246651 A1 Aug. 4, 2022

(30) Foreign Application Priority Data

Feb. 4, 2021 (JP) ................................ 2021-016447

(51) Int. Cl.
| | |
|---|---|
| *H04N 23/80* | (2023.01) |
| *H04N 23/60* | (2023.01) |
| *H04N 23/617* | (2023.01) |
| *H04N 25/79* | (2023.01) |

(52) U.S. Cl.
CPC .......... *H04N 23/80* (2023.01); *H04N 23/617* (2023.01); *H04N 23/665* (2023.01); *H04N 25/79* (2023.01)

(58) Field of Classification Search
None
See application file for complete search history.

(56) References Cited

U.S. PATENT DOCUMENTS

| | | | | |
|---|---|---|---|---|
| 2008/0143264 A1* | 6/2008 | Minami | ............ | H10K 59/1216 445/24 |
| 2013/0240883 A1* | 9/2013 | Chen | ...................... | H01L 24/13 257/E21.59 |
| 2021/0168318 A1* | 6/2021 | Eki | ...................... | H04N 25/709 |
| 2021/0385403 A1* | 12/2021 | Eki | ................ | H01L 27/14634 |
| 2022/0149101 A1* | 5/2022 | Lee | .................... | H01L 27/1464 |
| 2022/0238470 A1* | 7/2022 | Iwata | ................. | H01L 27/1446 |
| 2022/0246661 A1* | 8/2022 | Itano | ................ | H01L 27/14603 |
| 2022/0247944 A1* | 8/2022 | Kobayashi | ........... | H04N 25/772 |
| 2022/0247948 A1* | 8/2022 | Sato | ...................... | H04N 25/79 |
| 2022/0385809 A1* | 12/2022 | Kai | ........................ | H04N 23/80 |
| 2023/0113504 A1* | 4/2023 | Kobayashi | ............. | H04N 25/60 348/135 |
| 2023/0156375 A1* | 5/2023 | Okuike | .................. | H04N 25/79 348/302 |
| 2023/0209227 A1* | 6/2023 | Yamashita | ............. | H04N 25/78 348/308 |

FOREIGN PATENT DOCUMENTS

| | | |
|---|---|---|
| EP | 3876521 A1 | 9/2021 |
| JP | 2020025263 A | 2/2020 |

* cited by examiner

*Primary Examiner* — Paul M Berardesca
(74) *Attorney, Agent, or Firm* — Canon U.S.A., Inc. IP Division

(57) ABSTRACT

A photoelectric conversion apparatus includes a photoelectric conversion region provided with a plurality of photoelectric conversion units, a signal processing unit configured to process an output signal from the plurality of photoelectric conversion units, and a processing unit configured to perform processing based on a learned model on data processed by the signal processing unit. The photoelectric conversion apparatus also includes a first pad connected to the processing unit and a second pad connected to the signal processing unit.

30 Claims, 22 Drawing Sheets

FIG. 19B
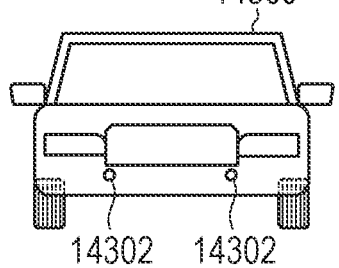
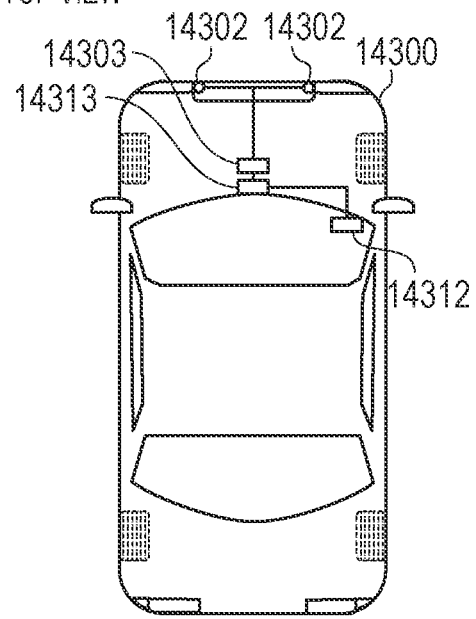
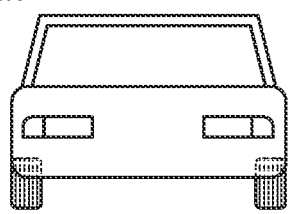

PHOTOELECTRIC CONVERSION APPARATUS HAVING PAD ARRANGEMENT

BACKGROUND

Field of the Disclosure

The aspect of the embodiments relates to an arrangement of signal processing circuits included in a photoelectric conversion apparatus.

Description of the Related Art

In recent years, it is desired that advanced signal processing be executed inside a photoelectric conversion apparatus from the viewpoint of, for example, supporting an increasing variety of image processing and increasing the speed of image processing.

Japanese Patent Laid-Open No. 2020-25263 describes a multilayer photoelectric conversion apparatus in which a first substrate and a second substrate are stacked one on top of the other. The first substrate is provided with a photoelectric conversion region having a plurality of photoelectric conversion units (an image capturing unit). The second substrate is provided with a digital signal processor (DSP) that performs signal processing on signals obtained from a pixel array arranged on the first substrate. A learned model, which is a program related to machine learning, is stored in a memory, and the DSP can perform signal processing based on the learned model. Thus, more advanced signal processing than before can be performed inside the photoelectric conversion apparatus.

In Japanese Patent Laid-Open No. 2020-25263, there is not disclosed a specific configuration of an output wiring line from the DSP and a power supply wiring line to the DSP, and their study is thus insufficient.

SUMMARY OF THE DISCLOSURE

A photoelectric conversion apparatus according to the present invention includes a photoelectric conversion region provided with a plurality of photoelectric conversion units, a signal processing unit configured to process an output signal from the plurality of photoelectric conversion units, a processing unit configured to perform processing based on a learned model on data processed by the signal processing unit, a first pad connected to the processing unit, and a second pad connected to the signal processing unit and different from the first pad.

Further features of the disclosure will become apparent from the following description of exemplary embodiments with reference to the attached drawings.

BRIEF DESCRIPTION OF THE DRAWINGS

FIGS. 19A and 19B are diagrams illustrating a photoelectric conversion system and a moving object according to a thirteenth embodiment.

DESCRIPTION OF THE EMBODIMENTS

Figure 1:
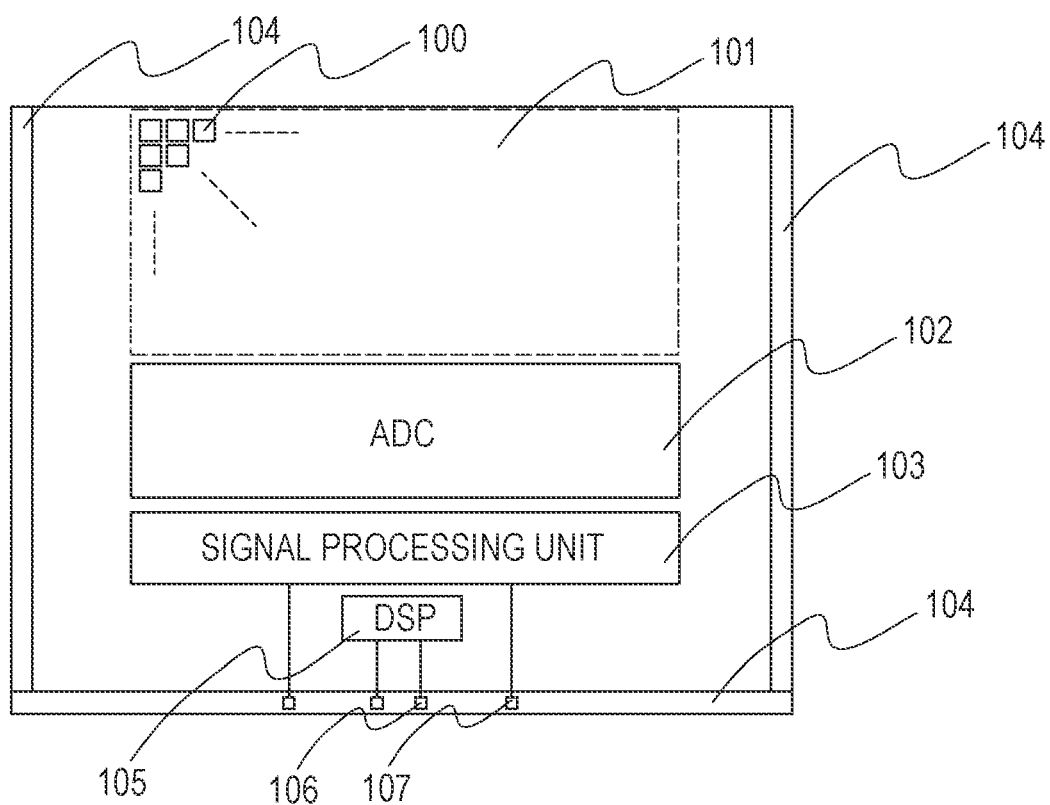
FIG. 1 is a diagram of the configuration of a photoelectric conversion apparatus according to a first embodiment.

In the following, embodiments of the present disclosure will be described in detail with reference to the drawings. In the following embodiments, identical portions will be denoted by the same reference numeral, and redundant description will be omitted. In the present specification, "in a plan view" refers to viewing from a direction orthogonal to a light incident surface of a substrate.

First Embodiment

A first embodiment will be described using FIG. 1.

FIG. 1 is a diagram of the configuration of a photoelectric conversion apparatus according to the present embodiment. In FIG. 1, a plurality of pixels 100 are two-dimensionally arranged in the photoelectric conversion apparatus. Each of the plurality of pixels 100 is provided with a photoelectric conversion unit including a photodiode, and thus a region where the plurality of pixels 100 are arranged is called a photoelectric conversion region 101. The photoelectric conversion region 101 may also be called a pixel region since the plurality of pixels 100 are arranged in the photoelectric conversion region 101. In a case where the photoelectric conversion apparatus is used as an image capturing apparatus, the photoelectric conversion region 101 may be called an image capturing region or an image capturing unit. Each pixel may have a photoelectric conversion unit and a pixel circuit that reads out an electric charge generated by the photoelectric conversion unit. For example, the pixel circuit may include a transfer transistor, an amplification transistor, a reset transistor, a selection transistor, or a capacitor switching transistor. Alternatively, a plurality of photoelectric conversion units including avalanche photodiodes (APDs)

may be arranged in the photoelectric conversion region 101. Furthermore, the APDs may be single-photon avalanche diodes (SPADs).

Signals from the photoelectric conversion region 101 are output to analog-to-digital conversion circuits (ADC circuits) 102. The ADC circuits 102 are provided so as to correspond to, for example, predetermined pixel columns.

Each ADC circuit 102 converts an analog signal into a digital value to generate digital data. The ADC circuit 102 may include, for example, a voltage generation circuit that generates a driving voltage for driving elements in the photoelectric conversion region. Digital data generated by the ADC circuit 102 is output to a signal processing unit 103. Note that FIG. 1 illustrates an example in which column circuits are provided with the respective ADC circuits 102. However, each of the plurality of photoelectric conversion units may be provided with one ADC circuit 102. Alternatively, blocks into which the plurality of photoelectric conversion units are divided may each be provided with one ADC circuit 102.

The signal processing unit 103 performs various types of signal processing on digital data input from the ADC circuits 102. For example, in a case where data to be processed is a color image, the signal processing unit 103 performs a format conversion on the data concerning this color image into YUV image data, RGB image data, or the like. The signal processing unit 103 performs, for example, processing such as noise reduction or white balance adjustment on image data, which is a processing target, as needed. In addition, the signal processing unit 103 performs, on image data to be processed, various types of signal processing (also called preprocessing) that are necessary in a case where a DSP 105 processes the image data.

The DSP 105 has a memory (not illustrated). A program is stored in the memory, and the DSP 105 performs various types of processing using a learned model (also called a neural network calculation model) by executing the stored program. That is, the DSP 105 is a processing unit that performs processing based on the learned model on data processed by the signal processing unit 103. The learned model is generated, for example, through machine learning using a deep neural network (DNN). The learned model may be designed on the basis of parameters generated by inputting, to a certain machine learning model, an input signal corresponding to an output from the photoelectric conversion region 101 and training data associated with a label corresponding to the input signal. The certain machine learning model may be a learning model using a multilayer neural network (also called a multilayer neural network model).

For example, the DSP 105 performs processing for multiplying data by a coefficient stored in the memory by executing processing based on the learned model stored in the memory. A result obtained by performing such processing (an arithmetic operation result) is output to the memory. Alternatively, the arithmetic operation result is directly output to the outside without using the memory. The arithmetic operation result may include image data obtained by performing processing using the learned model or various types of information (metadata) obtained from the image data. Examples of the processing include object recognition and position measurement. A memory controller that controls access to the memory may be built in the DSP 105.

Data to be processed by the DSP 105 may be data read out from the photoelectric conversion region 101 or data obtained by reducing the data size of the read-out data by dropping some of the pixels of the read-out data at certain intervals. Alternatively, data concerning all the pixels of the photoelectric conversion region 101 is not read out, and data concerning pixels obtained by dropping some of all the pixels at certain intervals may be read out.

The memory of the DSP 105 stores, as needed, digital data output from the ADC circuits 102, data on which signal processing is performed by the signal processing unit 103, an arithmetic operation result obtained by the DSP 105, or the like.

The DSP 105 can reconstruct a learning model by using the training data and changing weights of various parameters in the learning model. The DSP 105 may have a plurality of learning models, which are ready for use, and can perform an arithmetic operation in which the learning model in use is changed in accordance with the content of processing. Furthermore, the DSP 105 can acquire a learning model, which is a learned model, from an external apparatus and perform the processing above.

Example: Used as Output Pads

A pad array region 104 is a region where a plurality of pads are arranged. The plurality of pads include a pad for supplying a voltage to the photoelectric conversion apparatus from the outside and a pad for outputting a signal from the photoelectric conversion apparatus. In a case where the photoelectric conversion apparatus is viewed in a plan view, the pad array region 104 can be provided at four sides of the substrate. FIG. 1 illustrates an example in which the pad array region 104 is provided at three sides (the left side, the right side, and the bottom side) of the substrate.

For example, first pads 106 are pads that output data processed by the DSP 105 to the outside. Second pads 107 are pads that output data processed by the signal processing unit 103 to the outside. These pads are provided in the pad array region 104. Note that, in FIG. 1, an illustration of the other pads is omitted.

In Japanese Patent Laid-Open No. 2020-25263, there are described a case where a result obtained by performing processing on image data using a DSP and a case where image data output from a signal processing unit is output as is without performing processing on the image data using the DSP. However, in Japanese Patent Laid-Open No. 2020-25263, preprocessing data and post-processing data are output by switching a selector. In a case where such a configuration is used, both the preprocessing data and the post-processing data cannot be simultaneously output. In a case where these pieces of data are output successively, the output timing of the latter one of these pieces of data is determined by a time period necessary to output the former one of these pieces of data.

In contrast to this, in the present embodiment, data processed by the DSP 105 (post-processing data) and stored in the memory of the DSP 105 is output from the first pads 106. Data that is not processed by the DSP 105 (unprocessed data) and stored in the memory of the DSP 105 is output from the second pads 107. Specifically, the unprocessed data stored in the memory of the DSP 105 is output from the second pads 107 via the signal processing unit 103. Alternatively, as will be described later, the position of the memory can be selected as appropriate, and thus, for example, unprocessed data may be stored in a memory provided in the signal processing unit 103, and the data may be output from this memory to the second pads 107. In this manner, the present embodiment has a configuration with which unprocessed data and post-processing data can be output from the respective pads. Thus, when compared with Japanese Patent Laid-Open No. 2020-25263, a photoelectric conversion apparatus can be provided that makes it possible to increase the speed of signal output.

In the above, the example in which the memory is included in the DSP 105 has been described. However, the memory does not have to be provided in the DSP 105, and it is sufficient that the memory be provided somewhere in the photoelectric conversion apparatus. For example, a memory can be provided to the left and to the right of the ADC circuits 102 or can be provided to the left or to the right of the ADC circuits 102. A memory can also be provided to the left and to the right of the signal processing unit 103 or can be provided to the left or to the right of the signal processing unit 103. Furthermore, a memory can also be arranged in the ADC circuits 102, in the signal processing unit 103, or the like. The memory is configured to be able to store digital data output from the ADC circuits 102, data on which signal processing is performed by the signal processing unit 103, an arithmetic operation result obtained by the DSP 105, and so forth.

Data output from the first pads 106 and data output from the second pads 107 may be stored in separate memories or in the same memory. In a case where these pieces of data are stored in the same memory, it is sufficient that the first pads 106 and the second pads 107 be not electrically connected to each other such that signals output to the first pads 106 are not output to the second pads 107.

Example: Used as Power Source Pads

The first pads 106 and the second pads 107 may also be pads for supplying reference voltages. Specifically, the first pads 106 are pads that supply a reference voltage to the DSP 105. For example, the reference voltage may be any one out of a power source voltage (VDD), a ground voltage (GND), and an intermediate voltage of these voltages. The second pads 107 are pads that supply a reference voltage to the signal processing unit 103. For example, the reference voltage may be any one out of a power source voltage (VDD), a ground voltage (GND), and an intermediate voltage of these voltages.

In this manner, the signal processing unit 103 and the DSP 105 have respective pads through which the reference voltages are supplied, and thus there is a benefit in that crosstalk occurring between their power sources can be reduced. For example, in a case where the operating frequency of the signal processing unit 103 differs from that of the DSP 105, the occurrence of crosstalk may cause an unexpected operation. Moreover, in a case where the timing at which a current peak of the signal processing unit 103 occurs differs from the timing at which a current peak of the DSP 105 occurs, the occurrence of crosstalk may cause an unexpected operation. The possibility of occurrence of such an unexpected operation can be reduced.

Second Embodiment

A second embodiment will be described using FIGS. 2 and 3.

Figure 2:
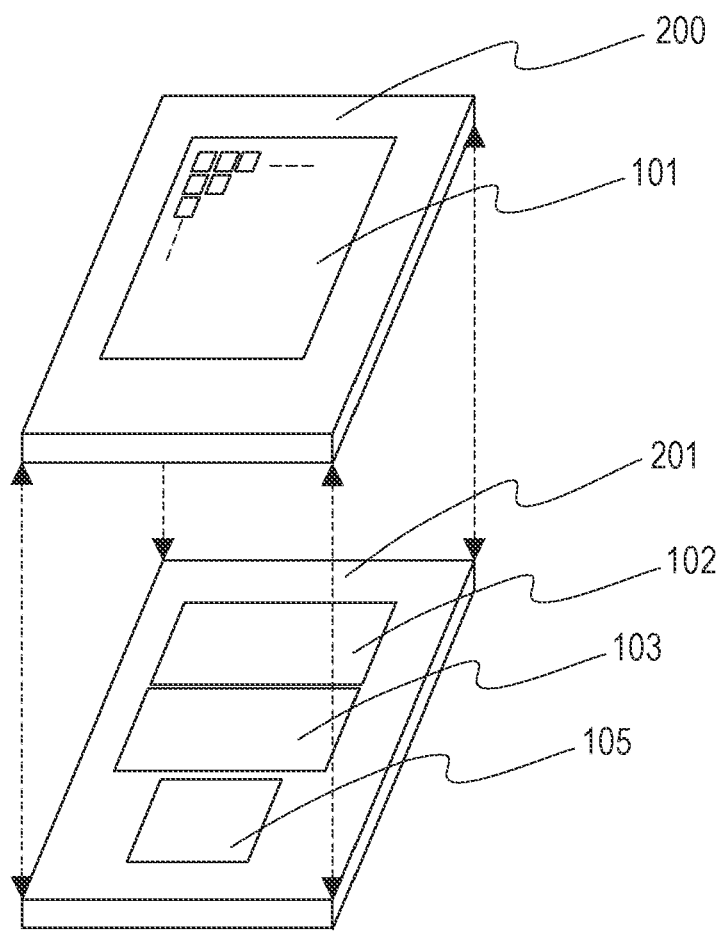
FIG. 2 is a diagram of the configuration of a photoelectric conversion apparatus according to a second embodiment.

FIG. 2 is a perspective view of a photoelectric conversion apparatus according to the present embodiment. A first substrate 200 is provided with the photoelectric conversion region 101. A second substrate 201 is provided with the ADC circuits 102, the signal processing unit 103, the DSP 105, and a memory (not illustrated).

To bond the first substrate 200 and the second substrate 201 together, each of the first substrate 200 and the second substrate 201 is divided into pieces (chips). Thereafter, the pieces of the first substrate 200 and those of the second substrate 201 can be bonded together. That is, a Chip-on-Chip (CoC) method may be used. Alternatively, one out of the first substrate 200 and the second substrate 201 (for example, the first substrate 200) is divided into pieces (chips). Thereafter, the pieces of the first substrate 200 and the second substrate 201, which is not divided into pieces (that is, in a wafer state), can be bonded together. That is, a Chip-on-Wafer method (CoW) may be used. Alternatively, a method may be used in which the first substrate 200 and the second substrate 201, which are both in a wafer state, are bonded together. That is, a Wafer-on-Wafer (WoW) method may be used.

In a method for bonding the first substrate 200 and the second substrate 201 together, for example, plasma bonding or the like can be used. Note that the bonding method is not limited thereto, and various bonding methods may be used.

To electrically connect the first substrate 200 and the second substrate 201 to each other, for example, two through-silicon vias (TSVs), which are a TSV provided in the first substrate 200 and a TSV provided from the first substrate 200 to the second substrate 201, may be connected to each other at a chip outer surface. This is a so-called twin TSV method. Moreover, a so-called shared TSV method or the like can be employed with which the first substrate 200 and the second substrate 201 are connected to each other using a common TSV provided from the first substrate 200 to the second substrate 201. Furthermore, various connection forms using a so-called Cu—Cu bonding method or the like can be employed with which copper (Cu) exposed from a bonding surface of the first substrate 200 and copper (Cu) exposed from a bonding surface of the second substrate 201 are bonded together.

Figure 3:
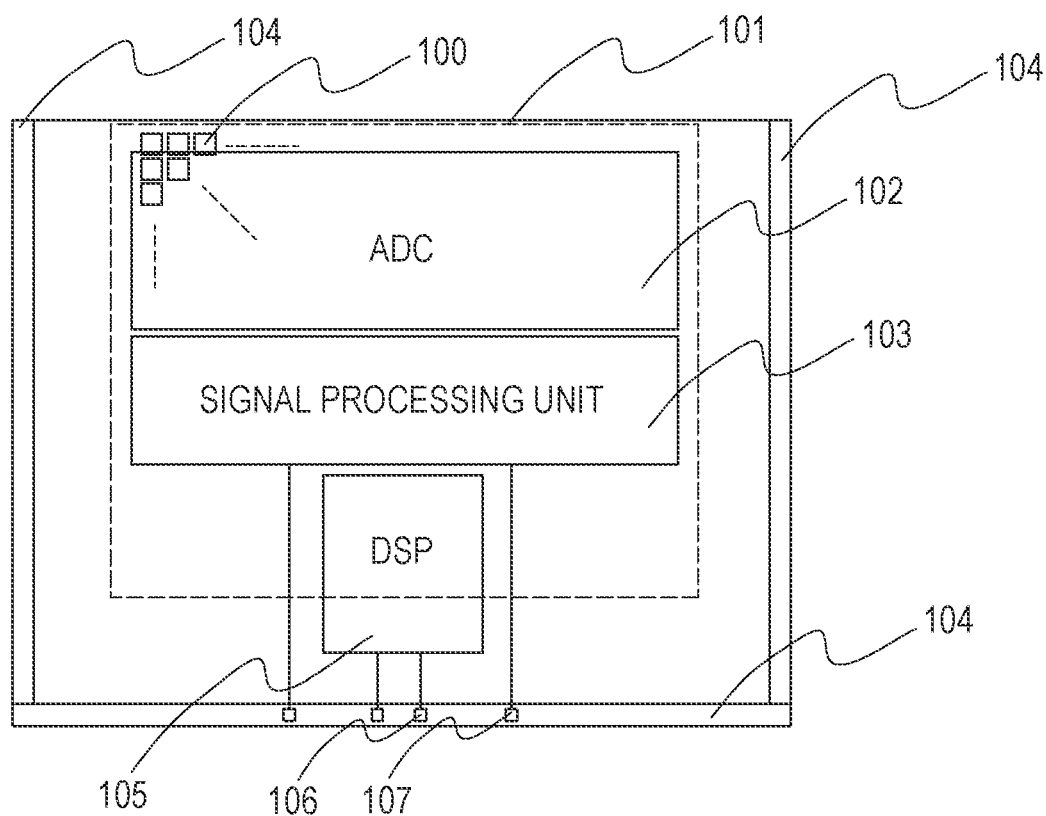
FIG. 3 is a plan view of the photoelectric conversion apparatus according to the second embodiment.

FIG. 3 is a plan view of the photoelectric conversion apparatus according to the present embodiment. When compared with FIG. 1, the area occupied by the photoelectric conversion region 101 is increased. As a result, it is possible to provide a photoelectric conversion apparatus having a greater number of pixels. When compared with FIG. 1, the area occupied by the ADC circuits 102, the area occupied by the signal processing unit 103, and the area occupied by the DSP 105 are also increased. By increasing the area occupied by the ADC circuits 102, a time period for performing ADC can be reduced. By increasing the area occupied by the signal processing unit 103 and that occupied by the DSP 105, concurrent processing or the like can be performed regarding signal processing or arithmetic processing, and a processing time period can be reduced even for large-scale data. The effect of, for example, heat generated due to processing can also be reduced.

Signals output from the photoelectric conversion region 101 are processed mainly in the order of the ADC circuits 102, the signal processing unit 103, and the DSP 105. Thus, circuit blocks are also arranged in the order of the ADC circuits 102, the signal processing unit 103, and the DSP 105. Thus, the DSP 105 is the last-stage block among these circuit blocks, and the DSP 105 has a region that does not overlap the photoelectric conversion region 101 in a plan view. Since the DSP 105 performs many arithmetic processing operations, it is highly likely that the DSP 105 generates heat or noise. If the photoelectric conversion region 101 overlaps the entirety of the DSP 105, heat or noise from the DSP 105 affects the photoelectric conversion region 101, and this may affect, for example, imaging quality or distance-measurement accuracy. According to the present embodiment, such effects can be reduced.

In terms of these effects, a form is also possible in which the photoelectric conversion region 101 and the DSP 105 are arranged so as not to overlap each other. As a result, the effects of the DSP 105 on the photoelectric conversion region 101 can be reduced to a greater degree.

Since the first pads 106 for the DSP 105 and the second pads 107 for the signal processing unit 103 are individually provided also in the present embodiment, the benefit described in the first embodiment can be acquired.

Note that pad electrodes for the first pads 106 and pad electrodes for the second pads 107 may be provided in a wiring layer of the first substrate 200 or may be provided in a wiring layer of the second substrate 201. In a case where all of the pad electrodes are provided in the wiring layer of either one of the substrates, a complicated process does not need to be employed in the process of forming pad openings.

Third Embodiment

A third embodiment will be described using FIGS. 4 and 5.

Figure 4:
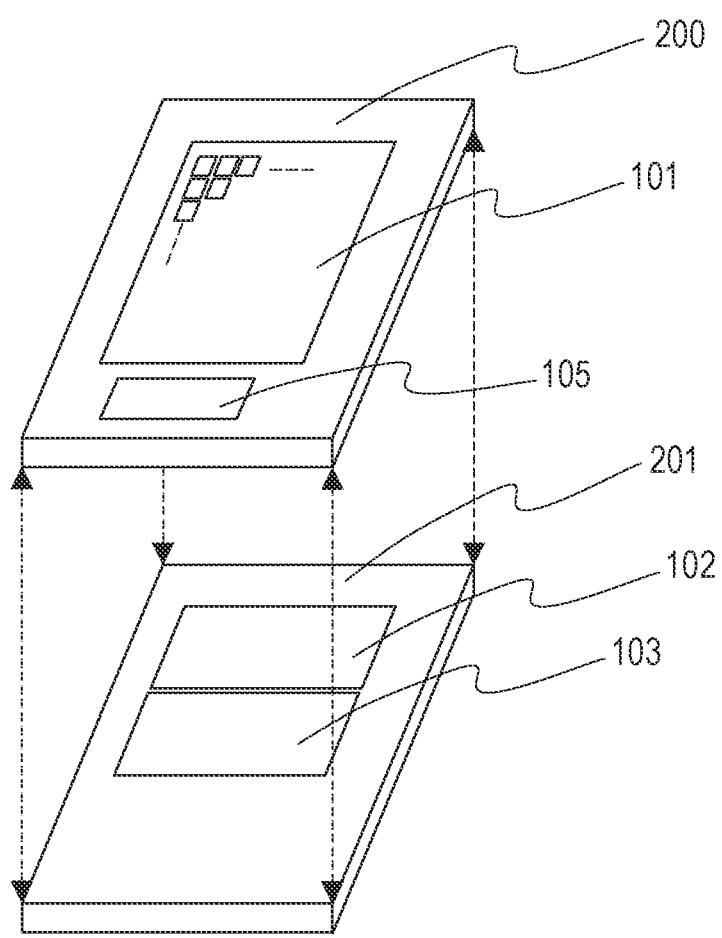
FIG. 4 is a diagram of the configuration of a photoelectric conversion apparatus according to a third embodiment.

FIG. 4 is a perspective view of a photoelectric conversion apparatus according to the present embodiment. The present embodiment differs from the second embodiment in that the first substrate 200 is provided with the photoelectric conversion region 101 and the DSP 105. Thus, the second substrate 201 is provided with the ADC circuits 102 and the signal processing unit 103 and is not provided with the DSP 105. The memory (not illustrated) may be provided on the first substrate 200 or the second substrate 201.

Figure 5:
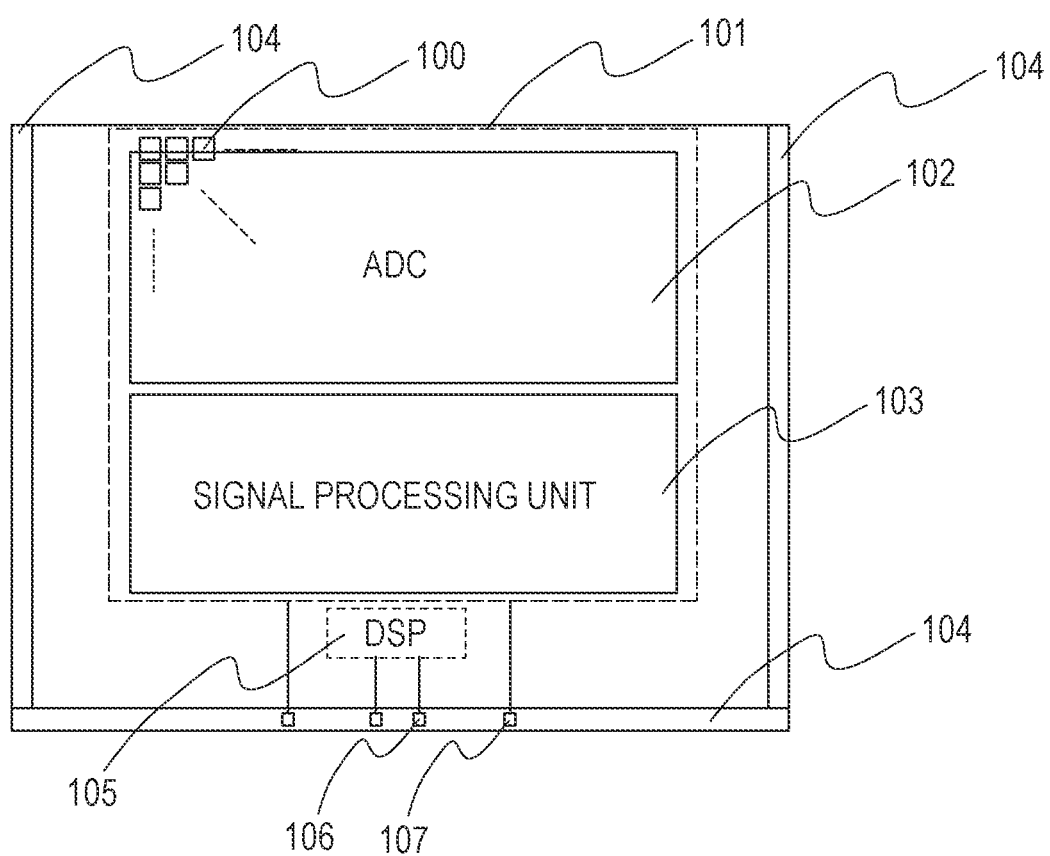
FIG. 5 is a plan view of the photoelectric conversion apparatus according to the third embodiment.

FIG. 5 is a plan view of the photoelectric conversion apparatus according to the present embodiment. FIG. 5 differs from FIG. 3 in that the first substrate 200 is provided with the DSP 105, and thus the area occupied by the ADC circuits 102 and that occupied by the signal processing unit 103 on the second substrate 201 are increased. As a result, for example, a time period for performing ADC at the ADC circuits 102 can be reduced, and a processing time period at the signal processing unit 103 can be reduced.

The first substrate 200 has the DSP 105 in a different region from the photoelectric conversion region 101. Thus, there is a benefit in that the effects of heat or noise from the DSP 105 on the photoelectric conversion region 101 can be reduced.

Since the first pads 106 for the DSP 105 and the second pads 107 for the signal processing unit 103 are individually provided also in the present embodiment, the benefit described in the embodiments above can be acquired.

Note that, in FIG. 4, the first substrate 200 is provided with the DSP 105, and the second substrate 201 is provided with the ADC circuits 102 and the signal processing unit 103. However, the signal processing unit 103 may be provided on the first substrate 200, and the DSP 105 may be provided on the second substrate 201. In this case, the signal processing unit 103 and the DSP 105 serving as heat generation blocks can be dispersedly arranged, and the effects of heat or noise on the photoelectric conversion region 101 can be reduced. Moreover, in a case where signals are input from the ADC circuits 102 to the DSP 105 without using the signal processing unit 103 and are processed, the configuration of a layout such as wiring is simplified.

Fourth Embodiment

A fourth embodiment will be described using FIGS. 6 to 9.

Figure 6:
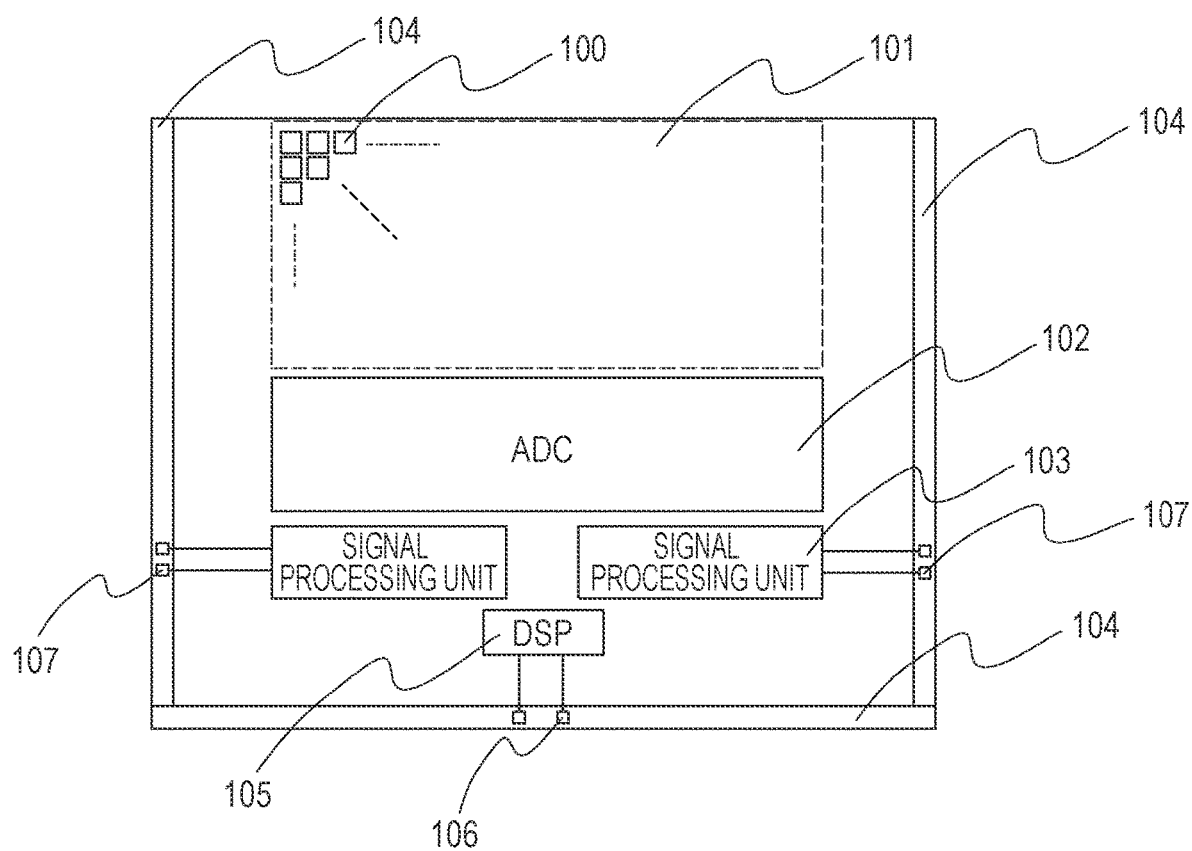
FIG. 6 is a plan view of a photoelectric conversion apparatus according to a fourth embodiment.

FIG. 6 is a plan view of a photoelectric conversion apparatus according to the present embodiment. FIG. 6 differs from FIG. 1 in that the first pads 106 for the DSP 105 and the second pads 107 for signal processing units 103 are provided at different sides of the pad array region 104.

In FIG. 6, if the second pads 107 for the signal processing units 103 are provided at positions at the same side where the first pads 106 for the DSP 105 are provided, the distance from each signal processing unit 103 to the corresponding second pads 107 is long. In an actual photoelectric conversion apparatus, many wiring lines other than the illustrated ones are routed. Thus, when the distance between each signal processing unit 103 and the corresponding pad is long, the layout of wiring lines may be complicated. Accordingly, as illustrated in FIG. 6, the second pads 107 for the signal processing units 103 are provided in areas of the pad array region 104 corresponding to the left and right sides of the substrate. In contrast, the first pads 106 for the DSP 105 are provided in an area of the pad array region 104 corresponding to the bottom side of the substrate.

The present layout can be expressed as in the following. That is, the shortest distance between one of the signal processing units 103 and a corresponding one of the sides (the right side) of the pad array region 104 where one of the second pads 107 is provided is referred to as a "first distance". The shortest distance between the signal processing unit 103 and the side (the bottom side) of the pad array region 104 where the first pads 106 are provided is referred to as a "second distance". In this case, the first distance is shorter than the second distance. The shortest distance between the DSP 105 and the side (the bottom side) of the pad array region 104 where the first pads 106 are provided is referred to as a "third distance". The shortest distance between the DSP 105 and the side (the right side) of the pad array region 104 where some of the second pads 107 are provided is referred to as a "fourth distance". In this case, the third distance is shorter than the fourth distance.

With such a configuration, the layout is simple, and the effects of interference between wiring lines or capacitive coupling between wiring lines can be reduced.

Furthermore, FIG. 6 differs from FIG. 1 in that two signal processing units 103 are provided.

For example, one of the two signal processing units 103 performs signal processing on an output from the left half of the photoelectric conversion region 101, and the other one of the two signal processing units 103 performs signal processing on an output from the right half of the photoelectric conversion region 101.

Figure 7:
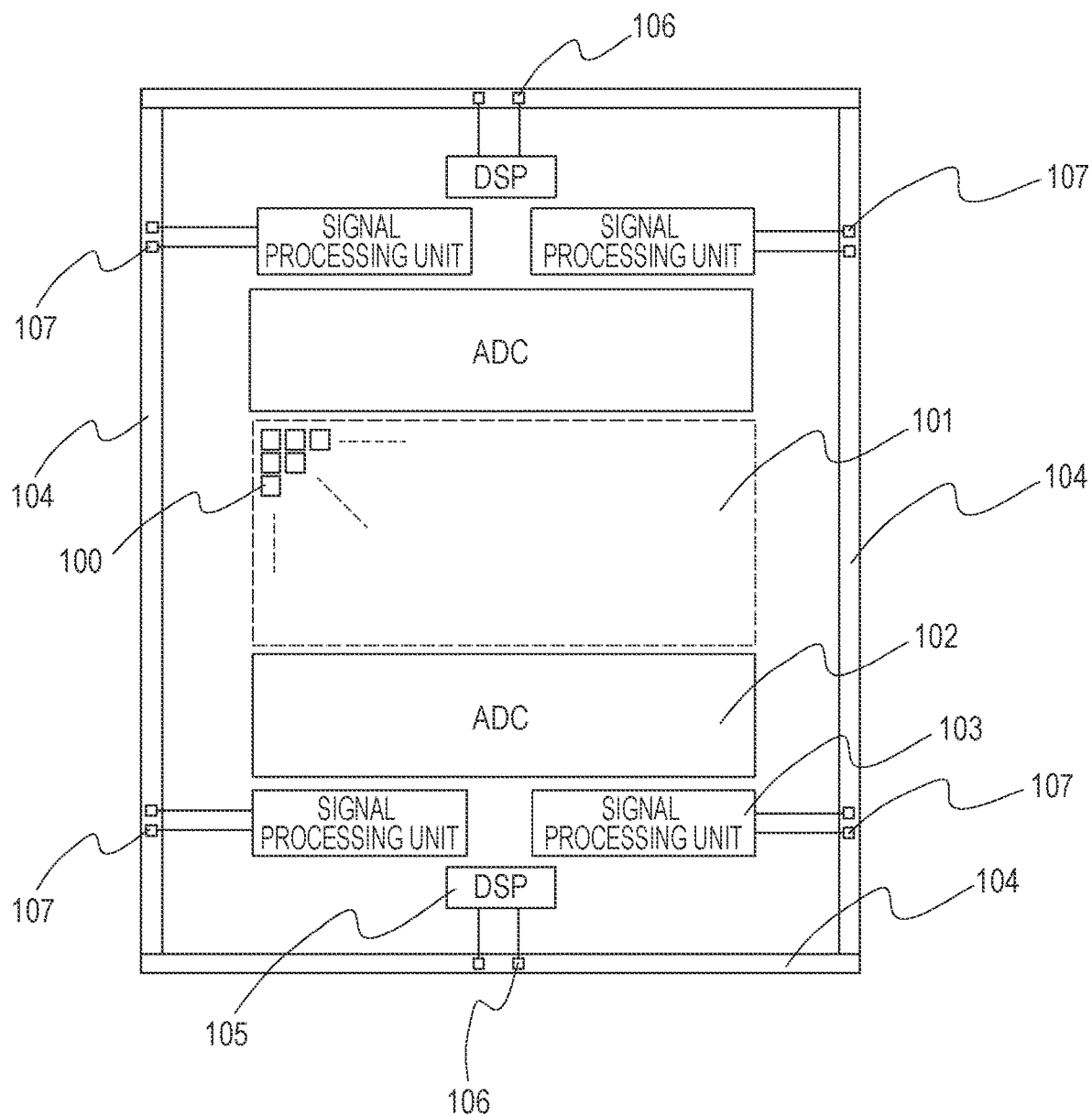
FIG. 7 is a plan view of a photoelectric conversion apparatus according to the fourth embodiment.

FIG. 7 illustrates a modification of FIG. 6. One group of ADC circuits 102, two signal processing units 103, and one DSP 105 are provided in FIG. 6, whereas another set of one group of ADC circuits 102, two signal processing units 103, and one DSP 105 is provided in FIG. 7. Specifically, in FIG. 7, a first set including the one group of ADC circuits 102, the two signal processing units 103, and the one DSP 105 (a first circuit group) is provided above the photoelectric conversion region 101. Moreover, a second set including the one group of ADC circuits 102, the two signal processing units 103, and the one DSP 105 (a second circuit group) is provided under the photoelectric conversion region 101. With such a configuration, an output from the upper half of the photoelectric conversion region 101 can be processed by the first circuit group, and an output from the lower half of the photoelectric conversion region 101 can be processed by the second circuit group. As a result, processing speed can be increased. Signals to be processed by the first circuit group and the second circuit group may be assigned on a column basis regarding the pixel columns arranged in the photoelectric conversion region 101.

In FIG. 7, the pad array region 104 is provided at the four sides of the substrate. Similarly to as in FIG. 6, pads are provided at positions close to the positions of the signal processing units 103 and the DSPs 105 in FIG. 7. Specifically, the second pads 107 for the signal processing units 103 are provided in areas of the pad array region 104 corresponding to the left side and the right side of the substrate. In contrast, first pads 106 for DSPs 105 are provided in areas of the pad array region 104 corresponding to the top side and the bottom side of the substrate.

Figure 8:
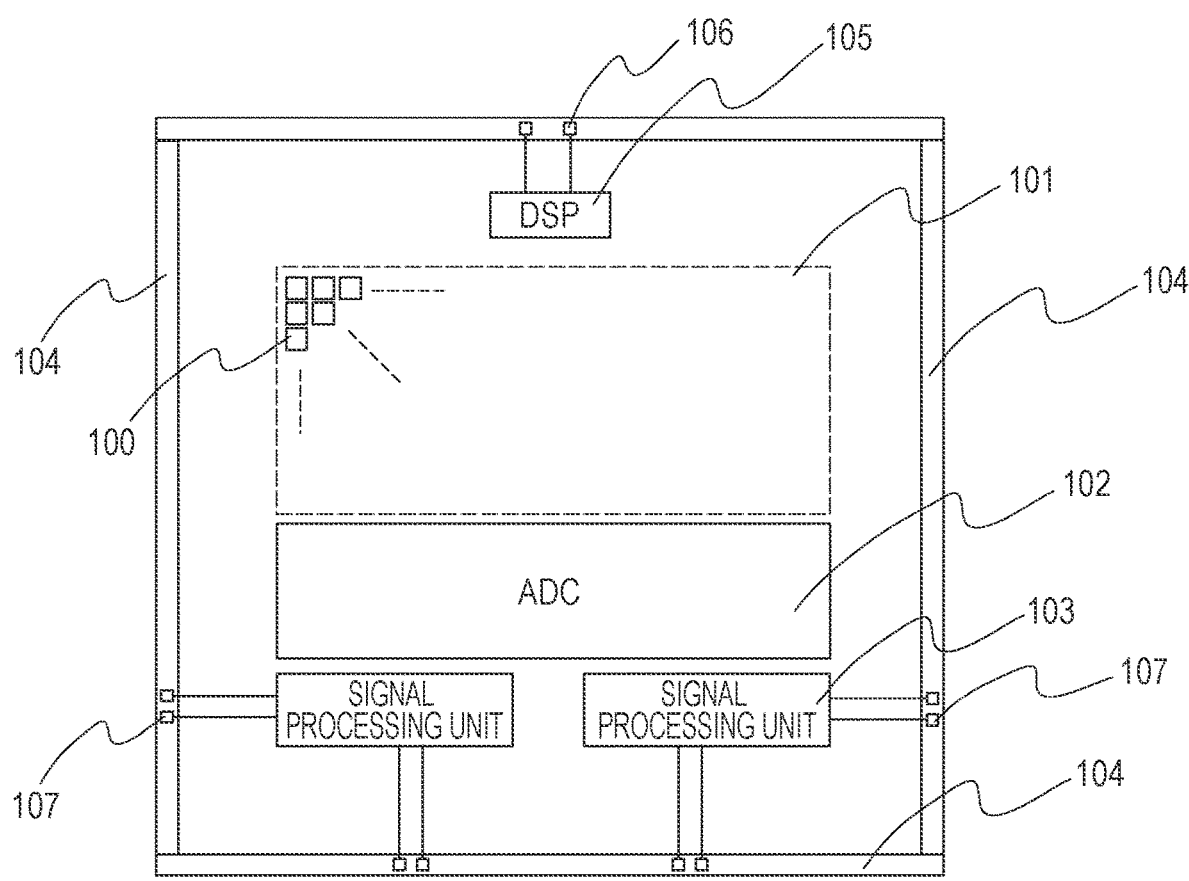
FIG. 8 is a plan view of a photoelectric conversion apparatus according to the fourth embodiment.

FIG. 8 illustrates a modification of FIG. 6. In FIG. 6, the signal processing units 103 and the DSP 105 are provided in the region under the photoelectric conversion region 101. FIG. 8 differs from FIG. 6 in that the DSP 105 is provided in the region above the photoelectric conversion region 101. Thus, by taking the distances to the pad array region 104 into consideration, the first pads 106 for the DSP 105 are provided in an area of the pad array region 104 corresponding to the top side of the substrate. The second pads 107 for the signal processing units 103 are provided in areas of the pad array region 104 corresponding to the left side, the right side, and the bottom side of the substrate.

In the example illustrated in FIG. 8, the ADC circuits 102 are arranged in the region under the photoelectric conversion region 101. The ADC circuits 102 and the DSP 105 are heat generation sources. Thus, when these are provided in a region on the same side with respect to the photoelectric conversion region 101 (the region on the bottom side in FIG. 8), the heat generation sources are arranged locally on the same side. In contrast to this, when the DSP 105 is arranged above and the ADC circuits 102 are arranged under the photoelectric conversion region 101 as illustrated in FIG. 8, the heat generation sources are dispersedly arranged. The effects on the photoelectric conversion region 101 can thus be suppressed.

Moreover, in the example illustrated in FIG. 8, the second pads 107 for the signal processing units 103 are arranged in the areas of the pad array region 104 corresponding to not only the left side and the right side but also the bottom side of the substrate. With such a configuration, equal-length wiring is not necessary, and it becomes easier to route wiring lines for which it is desired to avoid coupling. Pads used to supply power do not have to be designed by taking coupling with signal lines into consideration, and there is a benefit in that a simple wiring layout is possible.

Figure 9:
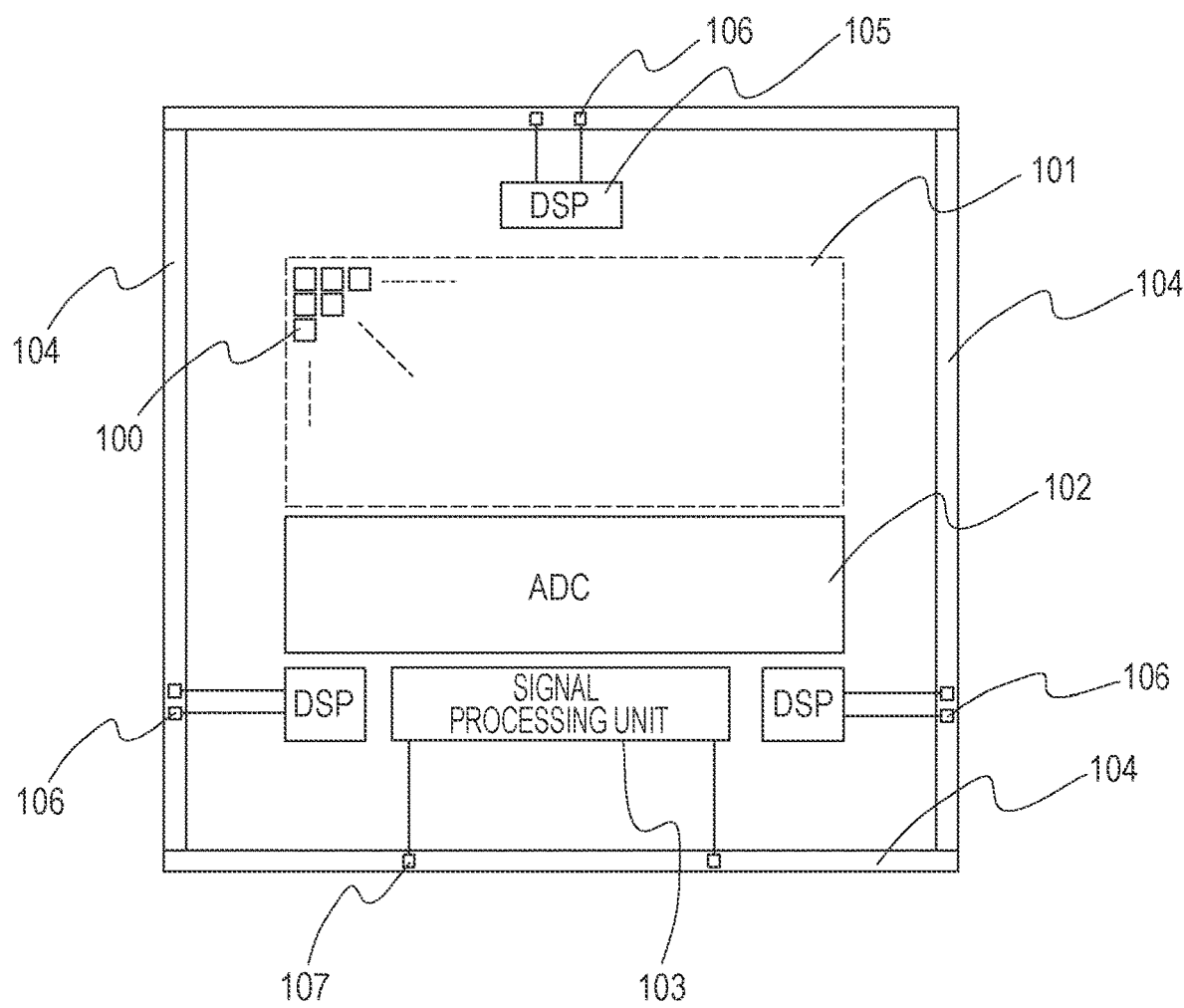
FIG. 9 is a plan view of a photoelectric conversion apparatus according to the fourth embodiment.

FIG. 9 illustrates a modification of FIG. 8. In FIG. 8, one DSP 105 is provided only in the region above the photoelectric conversion region 101. FIG. 9 differs from FIG. 8 in that, in addition to the DSP 105, two DSPs 105 are provided in the region under the photoelectric conversion region 101. That is, a plurality of DSPs 105 are arranged, and thus, for example, a processing time period can be reduced and the amount of heat to be generated can be suppressed through parallel processing. Learned models stored in the memories of the DSPs 105 may vary between the DSPs 105. For example, a learned model for recognizing objects in images may be stored in the memory of a first DSP, and a learned model for correcting luminance information or color information may be stored in the memory of a second DSP.

In FIG. 9, the first pads 106 for the DSPs 105 arranged at the lower left and the lower right of the substrate are provided in respective areas of the pad array region 104 corresponding to the left side and the right side of the substrate. Moreover, the second pads 107 for the signal processing unit 103 are provided in an area of the pad array region 104 corresponding to the bottom side of the substrate. With such a configuration, the wiring layout is simple, and the effects of interference between wiring lines or capacitive coupling between wiring lines can be reduced.

Since the first pads 106 for the DSPs 105 and the second pads 107 for the signal processing unit 103 are individually provided in the present embodiment, the benefit described in the first embodiment can be acquired.

Note that FIGS. 6 to 9 illustrate examples in which one substrate is provided with the photoelectric conversion region 101, the ADC circuits 102, the signal processing unit(s) 103, and the DSP(s) 105. However, as described in the second and third embodiments, this configuration can also be applied to photoelectric conversion apparatuses in which a first substrate and a second substrate are stacked one on top of the other. In this case, the configurations described in the above-described embodiments can be used as appropriate, and the individual benefits can be acquired.

Fifth Embodiment

A fifth embodiment will be described using FIG. 10.

Figure 10:
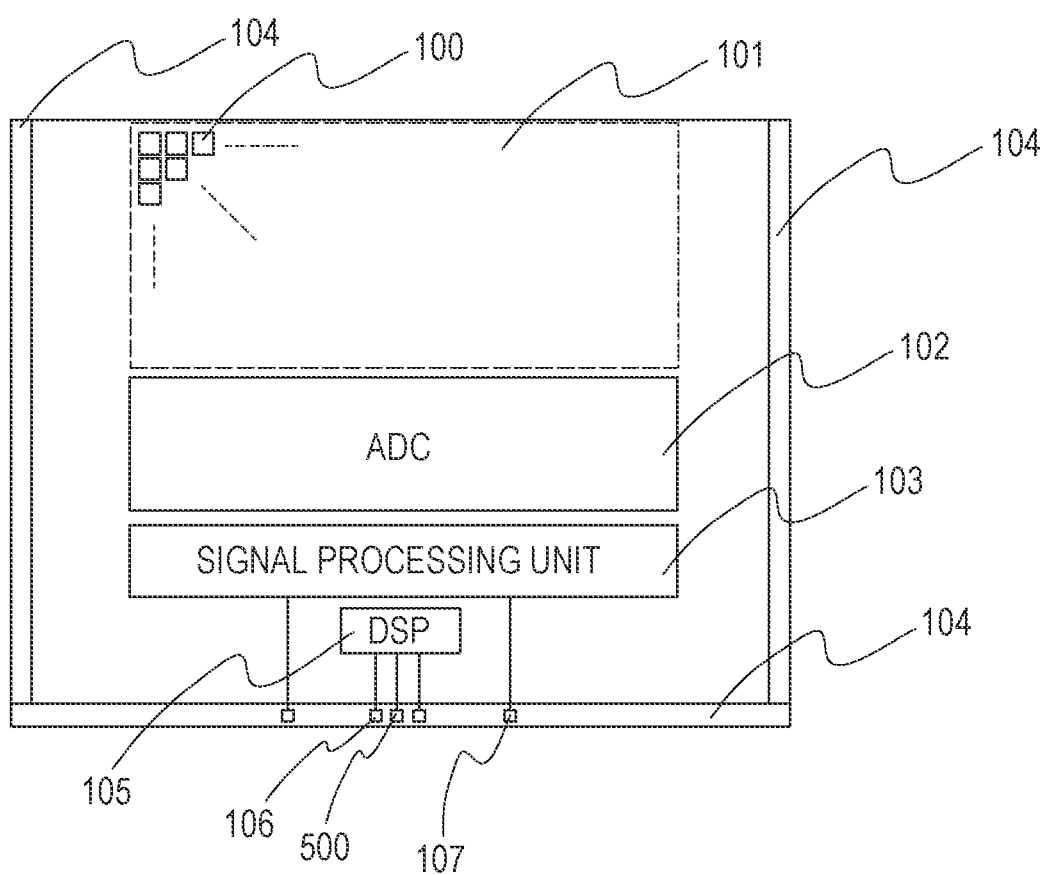
FIG. 10 is a plan view of a photoelectric conversion apparatus according to a fifth embodiment.

FIG. 10 is a plan view of a photoelectric conversion apparatus according to the present embodiment. FIG. 10 differs from FIG. 1 in that a third pad 500 provided for inputting a signal to the DSP 105 is provided.

In FIG. 10, the DSP 105 is arranged in the lower part of the substrate, that is, under the photoelectric conversion region 101. The first pads 106 and the third pad 500 for the DSP 105 are provided in an area of the pad array region 104 corresponding to the bottom side of the substrate. Since the third pad 500 for inputting a signal to the DSP 105 is provided so as to correspond to the position where the DSP 105 is provided, the wiring layout is simple, and the effects of, for example, noise due to interference between wiring lines or capacitive coupling between wiring lines can be reduced.

For example, a signal input to the third pad 500 is a clock signal supplied from the outside. The clock signal is a signal for generating a count signal to be used in processing operation performed by the DSP 105. The length of a wiring line routed from the third pad 500 to the DSP 105 can be reduced, and thus the amount of jitter in the clock signal can be reduced.

A signal input to the third pad 500 may be a signal from an external engine. The external engine is, for example, a processing block of a system arranged in the outside, and a signal from the external engine is a signal for specifying, in accordance with use of the system, an arithmetic processing method to be performed at the DSP 105. The length of a wiring line routed from the third pad 500 to the DSP 105 can be reduced. Thus, for example, the wiring layout is simple, and the effects of, for example, noise due to interference between wiring lines or capacitive coupling between wiring lines can be reduced.

Since the first pads 106 for the DSP 105 and the second pads 107 for the signal processing unit 103 are individually provided also in the present embodiment, the benefits described in the embodiments above can be acquired.

Note that FIG. 10 illustrates an example in which one substrate is provided with the photoelectric conversion region 101, the ADC circuits 102, the signal processing unit 103, and the DSP 105. However, as described in the second and third embodiments, this configuration can also be applied to photoelectric conversion apparatuses in which a first substrate and a second substrate are stacked one on top of the other.

In this case, the configurations described in the above-described embodiments can be used as appropriate, and the individual benefits can be acquired.

Sixth Embodiment

A sixth embodiment will be described using FIG. 11.

Figure 11:
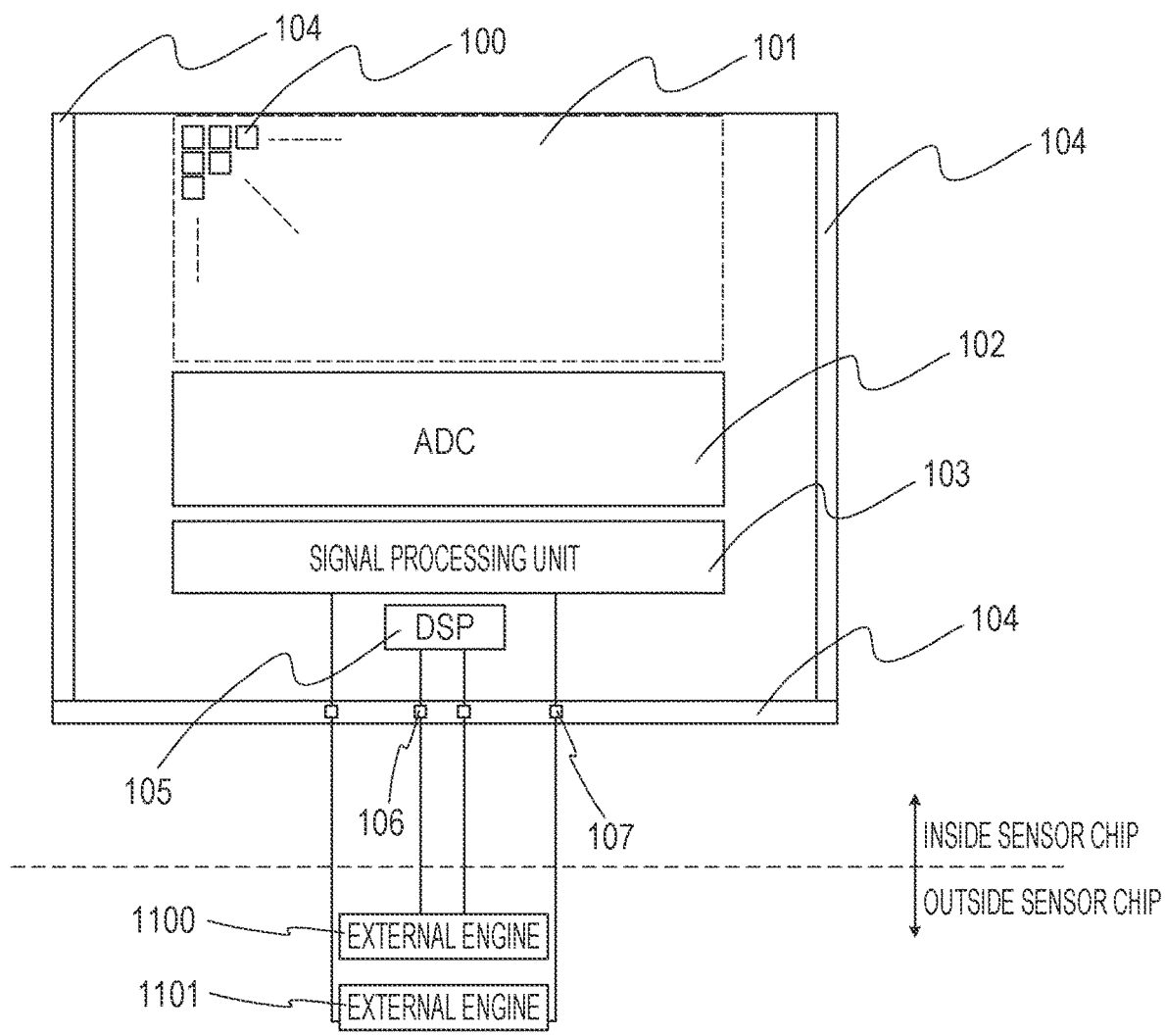
FIG. 11 is a plan view of a photoelectric conversion apparatus according to a sixth embodiment.

FIG. 11 is a plan view of a photoelectric conversion apparatus according to the present embodiment. FIG. 11 differs from FIG. 1 in that first pads 106 for the DSP 105 are connected to an external engine 1100, and second pads 107 for the signal processing unit 103 are connected to an external engine 1101.

FIG. 11 illustrates two first pads 106. One of the first pads 106 is a pad for a signal to be input to the DSP 105, and the other one of the first pads 106 is a pad for a signal to be output from the DSP 105. These pads are connected to the external engine 1100.

The external engine 1100 performs further signal processing on the basis of an output signal that is a processing result from the DSP 105. The DSP 105 is provided in the photoelectric conversion apparatus, and thus its signal processing power is subject to certain limitations. Thus, the DSP 105 is connected to the external engine 1100, the external engine 1100 performs signal processing, and the result from the external engine 1100 is fed back to the DSP 105.

FIG. 11 illustrates two second pads 107. One of the second pads 107 is a pad for a signal to be input to the signal processing unit 103, and the other one of the second pads 107 is a pad for a signal to be output from the signal processing unit 103. These pads are connected to the external engine 1101. The external engine 1101 performs further signal processing on the basis of an output signal that is a processing result from the signal processing unit 103. The signal processing unit 103 is provided in the photoelectric conversion apparatus, and thus its signal processing power is subject to certain limitations. Thus, the signal processing unit 103 is connected to the external engine 1101, the external engine 1101 performs signal processing, and the result from the external engine 1101 is fed back to the signal processing unit 103.

With such a configuration, external engines having high processing power can also be used, and the signal processing unit 103 and the DSP 105 can use respective external engines. Thus, there is a benefit in that the general-purpose versatility can be improved regarding individual processes.

Since the first pads 106 for the DSP 105 and the second pads 107 for the signal processing unit 103 are individually provided also in the present embodiment, the benefits described in the embodiments above can be acquired.

Note that FIG. 11 illustrates an example in which one substrate is provided with the photoelectric conversion region 101, the ADC circuits 102, the signal processing unit 103, and the DSP 105. However, as described in the second and third embodiments, this configuration can also be applied to photoelectric conversion apparatuses in which a first substrate and a second substrate are stacked one on top of the other.

In this case, the configurations described in the above-described embodiments can be used as appropriate, and the individual benefits can be acquired.

Seventh Embodiment

A seventh embodiment will be described using FIGS. 12 and 13.

Figure 12:
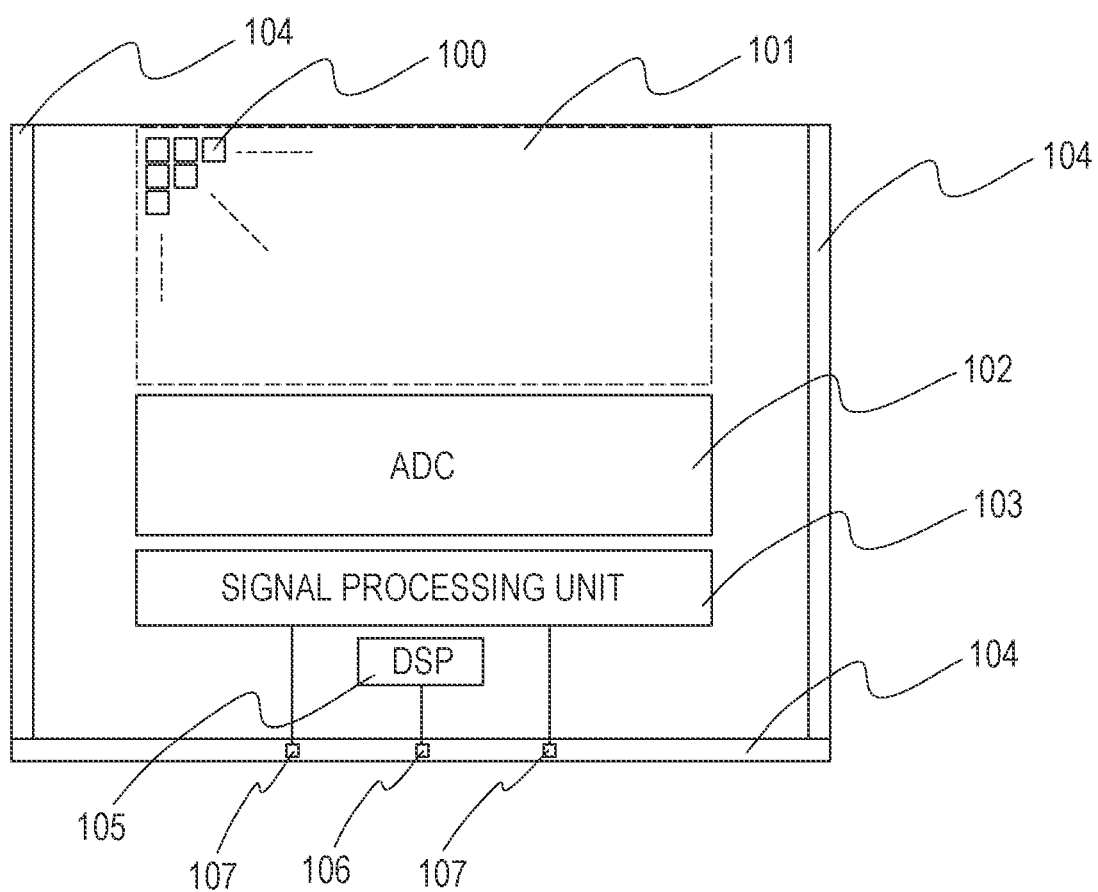
FIG. 12 is a plan view of a photoelectric conversion apparatus according to a seventh embodiment.

FIG. 12 is a plan view of a photoelectric conversion apparatus according to the present embodiment. FIG. 12 differs from FIG. 1 in that the number of first pads 106 for the DSP 105 illustrated in FIG. 12 is smaller than that in FIG. 1. Specifically, the number of first pads 106 for the DSP 105 is one in FIG. 12, whereas the number of first pads 106 for the DSP 105 is two in FIG. 1.

For example, the signal processing unit 103 processes outputs from the plurality of photoelectric conversion units provided in the photoelectric conversion region 101 to output image data, and thus the amount of information is large from the signal processing unit 103. In contrast, the DSP 105 processes image data from the signal processing unit 103 to output information regarding, for example, object recognition or distance measurement, and thus the amount of information is small from the DSP 105. Thus, a configuration can be used in which the number of first pads 106 for output from the DSP 105 is smaller than the number of second pads 107 for output from the signal processing unit 103. As a result, the number of pad electrodes can be reduced, and the area of the pad electrodes can be reduced.

Figure 13:
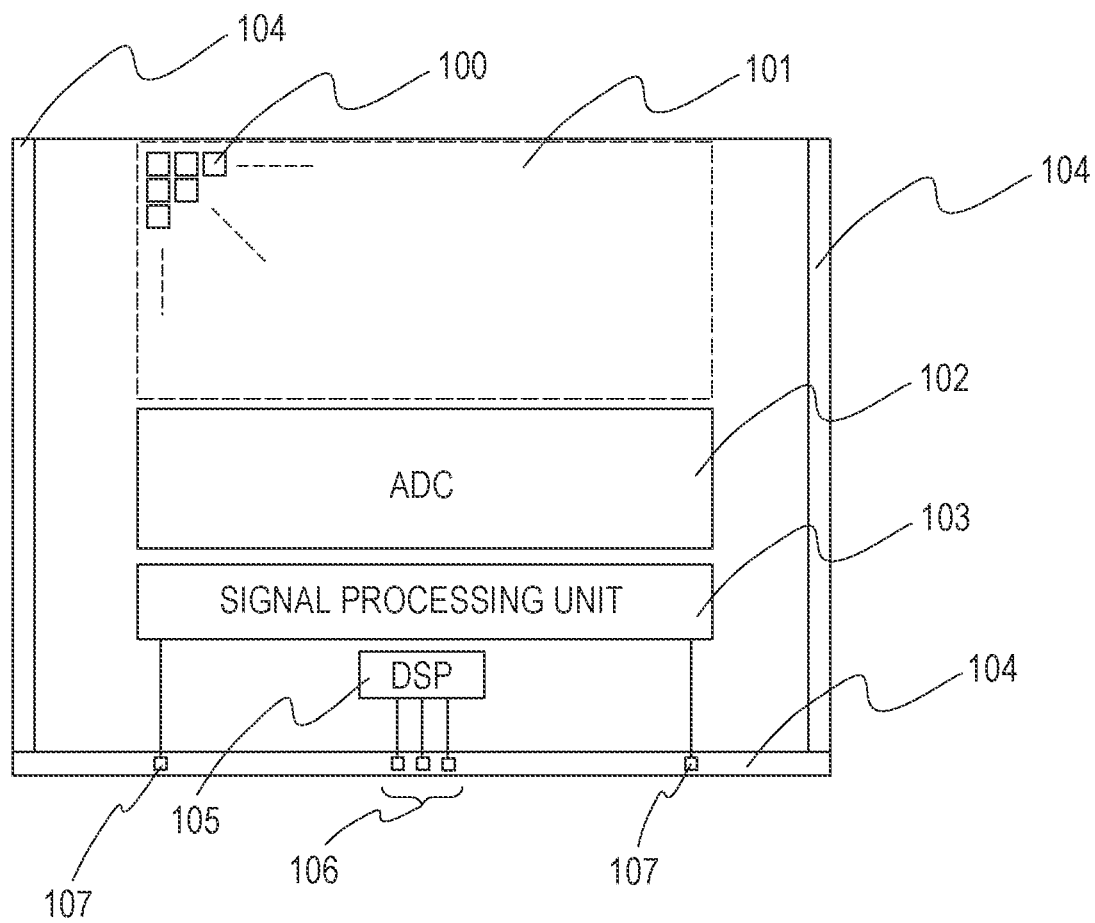
FIG. 13 is a plan view of a photoelectric conversion apparatus according to the seventh embodiment.

FIG. 13 is a plan view of a photoelectric conversion apparatus according to the present embodiment. FIG. 13 differs from FIG. 1 in that the number of first pads 106 for the DSP 105 illustrated in FIG. 13 is greater than that in FIG. 1. Specifically, the number of first pads 106 for the DSP 105 is three in FIG. 13, whereas the number of first pads 106 for the DSP 105 is two in FIG. 1.

For example, the DSP 105 processes the greater amount of information than the signal processing unit 103, and thus the power consumption of the DSP 105 may be high. That is, a large amount of current is consumed, and thus a current to be supplied is to be stabilized. Thus, a configuration can be used in which the number of first pads 106 supplying a voltage to the DSP 105 is larger than the number of second pads 107 supplying a voltage to the signal processing unit 103. As a result, variations in voltage to be supplied to the DSP 105 can be suppressed, and there is a benefit in that a stable current can be supplied.

Since the first pads 106 for the DSP 105 and the second pads 107 for the signal processing unit 103 are individually provided also in the present embodiment, the benefits described in the embodiments above can be acquired.

Note that FIGS. 12 and 13 illustrate examples in which one substrate is provided with the photoelectric conversion region 101, the ADC circuits 102, the signal processing unit 103, and the DSP 105. However, as described in the second and third embodiments, this configuration can also be applied to photoelectric conversion apparatuses in which a first substrate and a second substrate are stacked one on top of the other. In this case, the configurations described in the above-described embodiments can be used as appropriate, and the individual benefits can be acquired.

Eighth Embodiment

An eighth embodiment will be described using FIG. 14.

Figure 14:
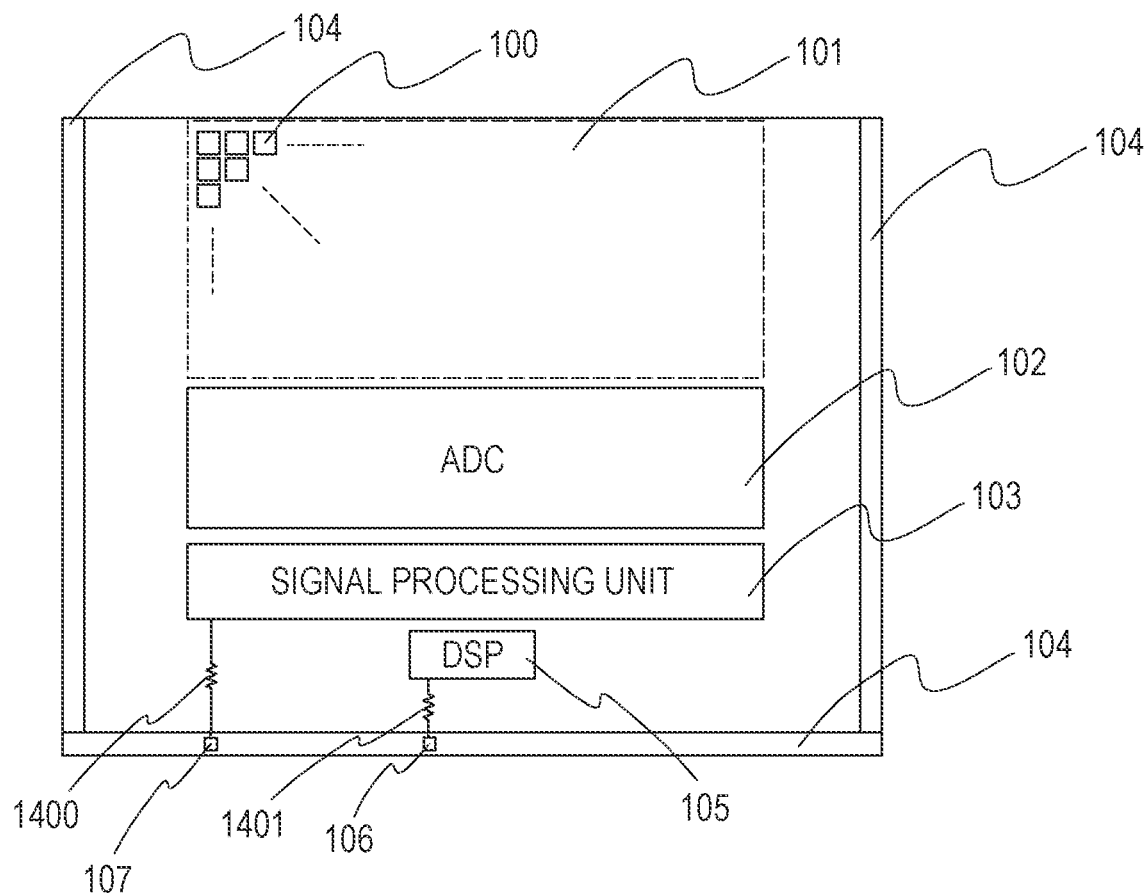
FIG. 14 is a plan view of a photoelectric conversion apparatus according to an eighth embodiment.

FIG. 14 is a plan view of a photoelectric conversion apparatus according to the present embodiment. FIG. 14 differs from FIG. 1 in that the resistance of the wiring line from the DSP 105 to the first pad 106 differs from the resistance of the wiring line from the signal processing unit 103 to the second pad 107.

For example, the DSP 105 processes the greater amount of information than the signal processing unit 103, and thus the power consumption of the DSP 105 may be high. That is, a large amount of current is consumed, and thus a current to be supplied is to be stabilized. Thus, a configuration can be used in which the resistance of a wiring line resistor 1401 from the DSP 105 to the first pad 106 is made lower than the resistance of a wiring line resistor 1400 from the signal processing unit 103 to the second pad 107. Specifically, as illustrated in FIG. 14, it is sufficient that the length of the wiring line from the DSP 105 to the first pad 106 be set to be shorter than that of the wiring line from the signal processing unit 103 to the second pad 107. Alternatively, it is sufficient that the thickness of the wiring line from the DSP 105 to the first pad 106 be set to be greater than that of the wiring line from the signal processing unit 103 to the second pad 107. Furthermore, the material of the wiring line from the DSP 105 to the first pad 106 may be made different from that of the wiring line from the signal processing unit 103 to the second pad 107 to reduce the resistance of the wiring line from the DSP 105 to the first pad 106. With such a configuration, there is a benefit in that a stable current can be supplied to the DSP 105.

Since the first pad 106 for the DSP 105 and the second pad 107 for the signal processing unit 103 are individually provided also in the present embodiment, the benefits described in the embodiments above can be acquired.

Note that FIG. 14 illustrates an example in which one substrate is provided with the photoelectric conversion region 101, the ADC circuits 102, the signal processing unit 103, and the DSP 105. However, as described in the second and third embodiments, this configuration can also be applied to photoelectric conversion apparatuses in which a first substrate and a second substrate are stacked one on top of the other.

In this case, the configurations described in the above-described embodiments can be used as appropriate, and the individual benefits can be acquired.

Ninth Embodiment

A ninth embodiment will be described using FIG. 15.

Figure 15:
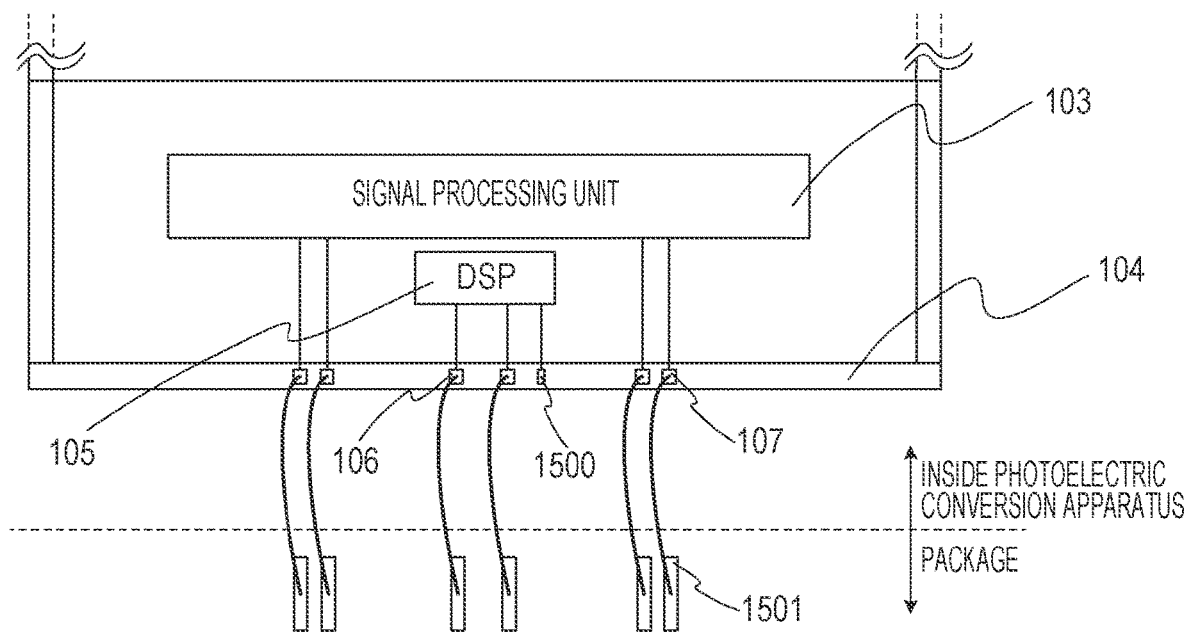
FIG. 15 is a plan view of a photoelectric conversion apparatus according to a ninth embodiment.

FIG. 15 is a plan view of a photoelectric conversion apparatus according to the present embodiment. FIG. 15 differs from FIG. 1 in that a fourth pad 1500 having a different size from the first pads 106 for the DSP 105 is provided.

For example, the fourth pad 1500 is a pad electrically connected to the DSP 105 and is used only for testing the DSP 105. Thus, the first pads 106 and the second pads 107 are electrically connected to pads 1501 of a package provided outside the photoelectric conversion apparatus; however, the fourth pad 1500 is not connected to a pad 1501 of the package. The fourth pad 1500 is used for testing, and the process for wire bonding mounting does not have to be taken into consideration. The area of the pad electrode of the fourth pad 1500 can thus be reduced. Thus, it becomes possible to arrange a greater number of first pads 106 or second pads 107, which are connected to an external device or external devices, in the pad array region 104. There is a benefit in that the degree of freedom in designing a wiring line layout increases.

Since the first pads 106 for the DSP 105 and the second pads 107 for the signal processing unit 103 are individually provided also in the present embodiment, the benefits described in the embodiments above can be acquired.

Note that FIG. 15 illustrates an example in which one substrate is provided with the photoelectric conversion region 101, the ADC circuits 102, the signal processing unit 103, and the DSP 105. However, as described in the second and third embodiments, this configuration can also be applied to photoelectric conversion apparatuses in which a first substrate and a second substrate are stacked one on top of the other.

In this case, the configurations described in the above-described embodiments can be used as appropriate, and the individual benefits can be acquired.

Tenth Embodiment

Figure 16:
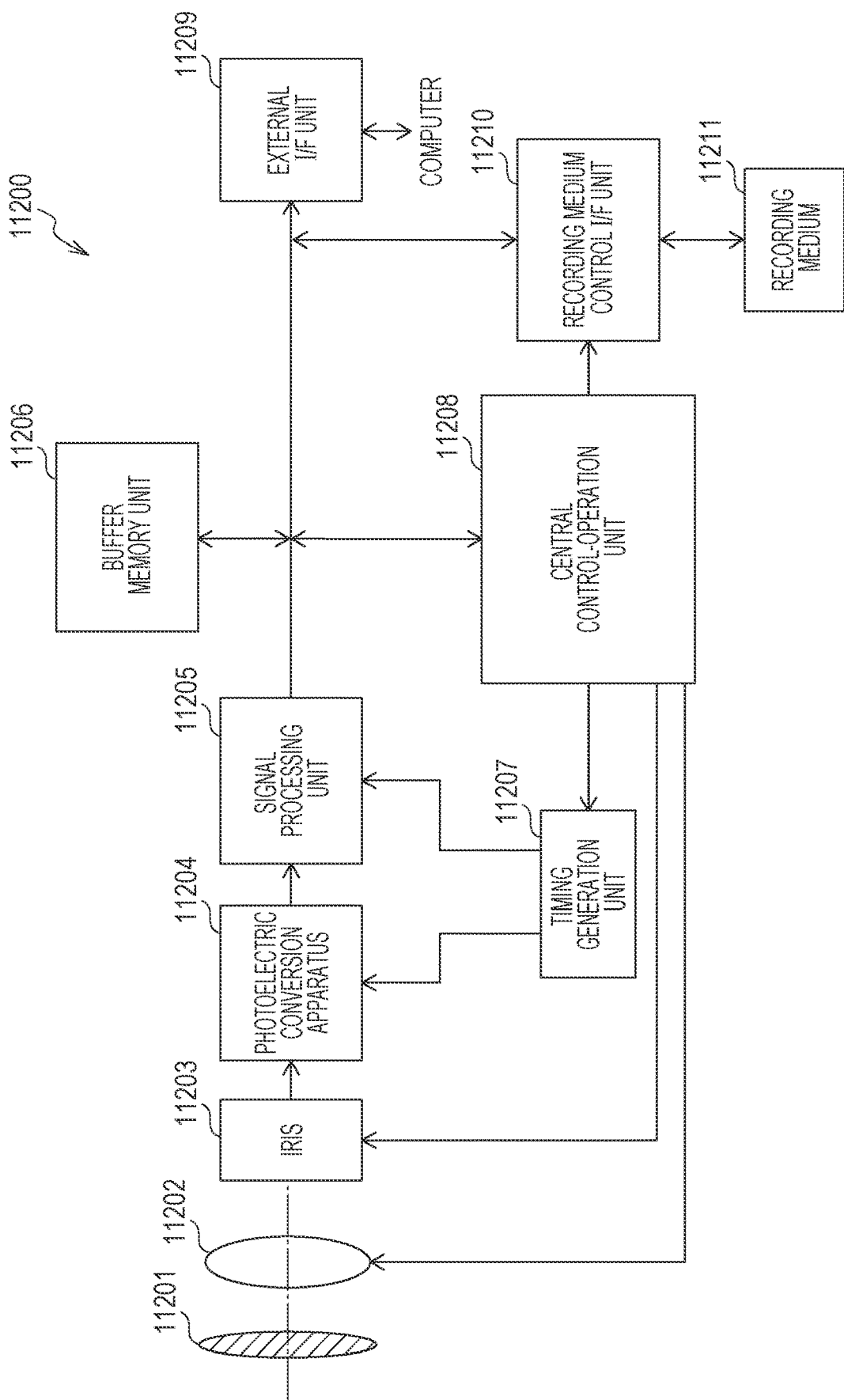
FIG. 16 is a functional block diagram of a photoelectric conversion system according to a tenth embodiment.

FIG. 16 is a block diagram illustrating the configuration of a photoelectric conversion system 11200 according to the present embodiment. The photoelectric conversion system 11200 according to the present embodiment includes a photoelectric conversion apparatus 11204. In this case, any one of the photoelectric conversion apparatuses described in the above-described embodiments can be used as the photoelectric conversion apparatus 11204. The photoelectric conversion system 11200 can be used as, for example, an image capturing system. Specific examples of the image capturing system include digital still cameras, digital camcorders, surveillance cameras, and network cameras. FIG. 16 illustrates an example of a digital still camera as the photoelectric conversion system 11200.

The photoelectric conversion system 11200 illustrated in FIG. 16 includes the photoelectric conversion apparatus 11204 and a lens 11202 for causing the photoelectric conversion apparatus 11204 to form an optical image of a subject. The photoelectric conversion system 11200 includes an iris 11203 for changing the amount of light passing through the lens 11202, and a barrier 11201 for protecting the lens 11202. The lens 11202 and the iris 11203 are an optical system for concentrating light onto the photoelectric conversion apparatus 11204.

The photoelectric conversion system 11200 includes a signal processing unit 11205, which processes an output signal output from the photoelectric conversion apparatus 11204. The signal processing unit 11205 performs a signal processing operation in which various types of correction or compression are performed on an input signal as needed. The photoelectric conversion system 11200 further includes a buffer memory unit 11206 for temporarily storing image data and an external interface (I/F) unit 11209 for communicating with an external computer or the like. Furthermore, the photoelectric conversion system 11200 includes a recording medium 11211 such as a semiconductor memory for recording or reading out captured image data and a recording medium control I/F unit 11210 for recording data in or reading out data from the recording medium 11211. The recording medium 11211 may be built in or detachable from the photoelectric conversion system 11200. The recording medium control I/F unit 11210 may wirelessly communicate with the recording medium 11211 and with the external interface I/F unit 11209.

Furthermore, the photoelectric conversion system 11200 includes a central control-operation unit 11208, which performs various types of arithmetic operations and also controls the entire digital still camera, and a timing generation unit 11207, which outputs various types of timing signals to the photoelectric conversion apparatus 11204 and the signal processing unit 11205. In this case, a timing signal and the like may be input from the outside. It is sufficient that the photoelectric conversion system 11200 include at least the photoelectric conversion apparatus 11204 and the signal processing unit 11205, which processes an output signal output from the photoelectric conversion apparatus 11204. The central control-operation unit 11208 and the timing generation unit 11207 may be configured to execute some or all of the control functions of the photoelectric conversion apparatus 11204.

The photoelectric conversion apparatus 11204 outputs a signal for an image to the signal processing unit 11205. The signal processing unit 11205 performs certain signal processing on the signal output from the photoelectric conversion apparatus 11204 to output image data. The signal processing unit 11205 also generates the image using the signal output from the photoelectric conversion apparatus 11204. The signal processing unit 11205 may also perform a distance-measurement arithmetic operation on the signal output from the photoelectric conversion apparatus 11204. Note that the signal processing unit 11205 or the timing generation unit 11207 may be built in the photoelectric conversion apparatus 11204. That is, the signal processing unit 11205 or the timing generation unit 11207 may be provided on a substrate where pixels are arranged or may be provided on another substrate. An image capturing system that can acquire higher quality images can be realized by forming the configuration of the image capturing system using a photoelectric conversion apparatus according to any one of the embodiments described above.

Eleventh Embodiment

Figure 17:
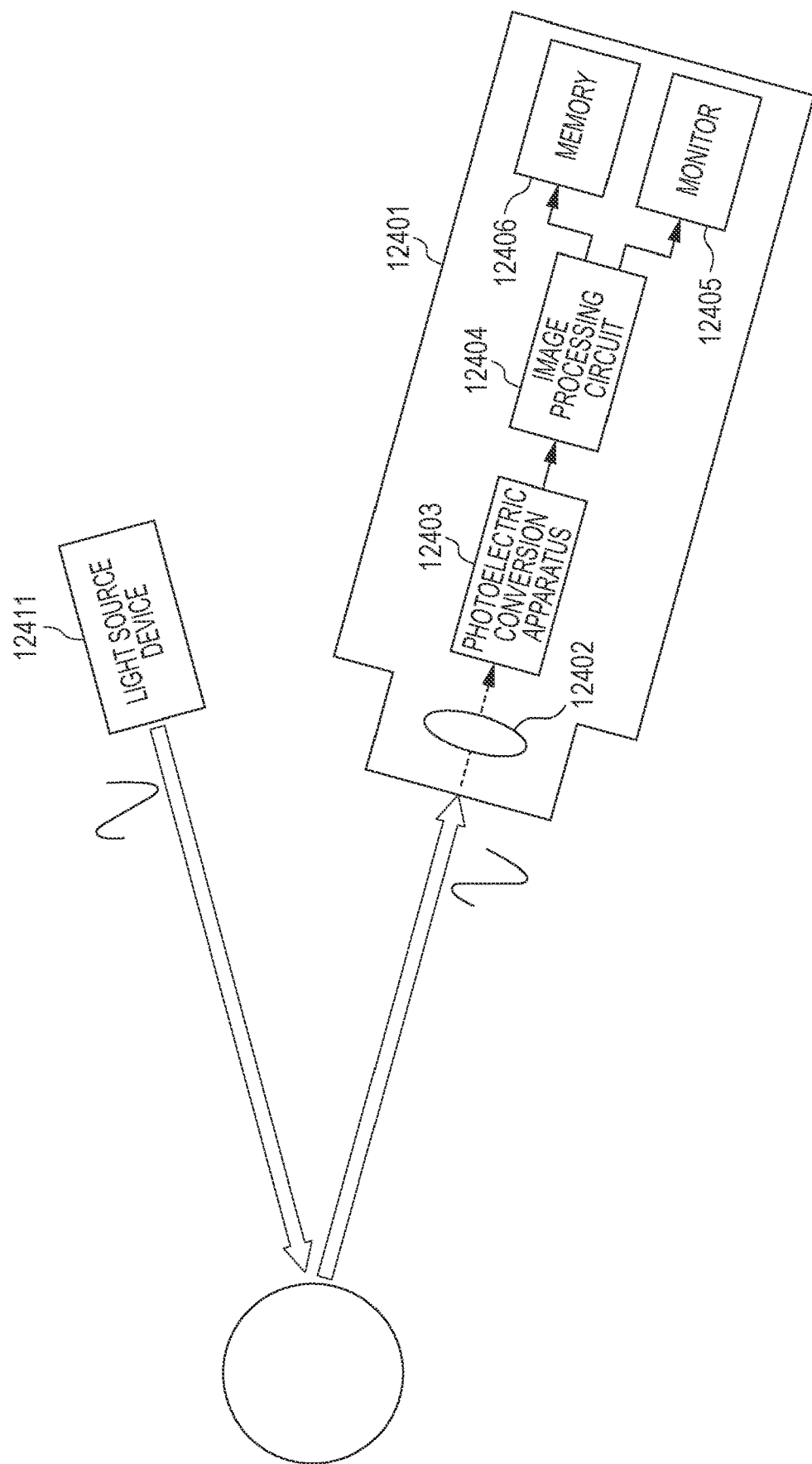
FIG. 17 is a functional block diagram of a distance sensor according to an eleventh embodiment.

FIG. 17 is a block diagram illustrating an example of the configuration of a distance image sensor, which is an electronic device using any one of the photoelectric conversion apparatuses described in the above-described embodiments.

As illustrated in FIG. 17, a distance image sensor 12401 includes an optical system 12402, a photoelectric conversion apparatus 12403, an image processing circuit 12404, a monitor 12405, and a memory 12406. The distance image sensor 12401 receives light emitted from a light source device 12411 to a subject and reflected by the surface of the subject (modulated light or pulsed light) and consequently can acquire a distance image corresponding to the distance to the subject.

The optical system 12402 includes one or more lenses. The optical system 12402 guides image light (incident light) from the subject to the photoelectric conversion apparatus 12403, and causes an image to be formed on a photosensitive surface (a sensor unit) of the photoelectric conversion apparatus 12403.

As the photoelectric conversion apparatus 12403, any one of the photoelectric conversion apparatuses according to the above-described embodiments is used. A distance signal representing a distance obtained from a light reception signal and output from the photoelectric conversion apparatus 12403 is supplied to the image processing circuit 12404.

The image processing circuit 12404 performs image processing in which a distance image is constructed on the basis of the distance signal supplied from the photoelectric conversion apparatus 12403. The distance image (image data) obtained as a result of the image processing is supplied to and displayed on the monitor 12405 or is supplied to and stored (recorded) in the memory 12406.

In the distance image sensor 12401 configured in this manner, the characteristics of pixels are improved by using one of the photoelectric conversion apparatuses described above and consequently, for example, a more accurate distance image can be acquired.

Twelfth Embodiment

The technology according to the present disclosure (the present technology) can be applied to various products. For example, the technology according to the present disclosure may be applied to an endoscopic operation system.

Figure 18:
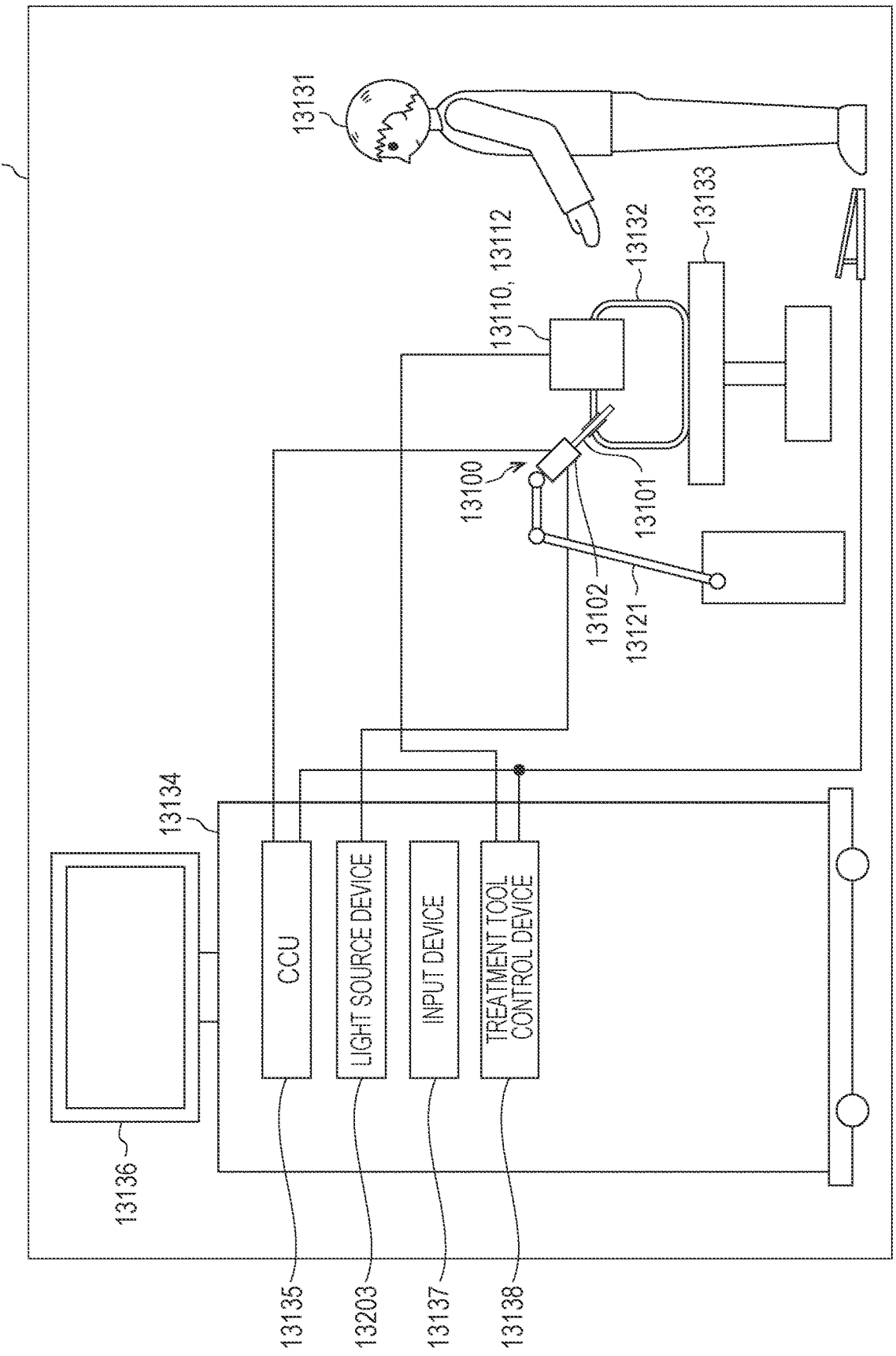
FIG. 18 is a functional block diagram of an endoscopic operation system according to a twelfth embodiment.

FIG. 18 is a diagram illustrating an example of a schematic configuration of an endoscopic operation system to which the technology according to the present disclosure (the present technology) can be applied.

FIG. 18 illustrates a situation in which a practitioner (a doctor) 13131 is performing a surgical operation on a patient 13132 on a patient bed 13133 by using an endoscopic operation system 13003. As illustrated in FIG. 18, the endoscopic operation system 13003 includes an endoscope 13100, a surgical tool 13110, and a cart 13134, on which various types of devices for endoscopic operations are mounted.

The endoscope 13100 includes a lens tube 13101 and a camera head 13102. A portion of the lens tube 13101 starting from its leading edge and having a predetermined length is inserted into a body cavity of the patient 13132. The camera head 13102 is connected to a base end of the lens tube 13101. In the illustrated example, the endoscope 13100 is formed as a rigid scope including the lens tube 13101, which is rigid; however, the endoscope 13100 may be formed as a so-called flexible scope having a flexible lens tube.

The leading edge of the lens tube 13101 is provided with an opening in which an objective lens is embedded. The endoscope 13100 is connected to a light source device 13203. Light generated by the light source device 13203 is guided to the leading edge of the lens tube 13101 along a light guide extended in the lens tube 13101. This light is emitted toward an observation target in the body cavity of the patient 13132 through the objective lens. Note that the endoscope 13100 may be a direct-viewing endoscope, an oblique-viewing endoscope, or a side-viewing endoscope.

The camera head 13102 includes an optical system and a photoelectric conversion apparatus. Reflected light (observation light) from the observation target is concentrated by the optical system onto the photoelectric conversion apparatus. The observation light is photoelectrically converted by the photoelectric conversion apparatus, and an electric signal corresponding to the observation light, that is, an image signal corresponding to an observation image is generated. As the photoelectric conversion apparatus, any one of the photoelectric conversion apparatuses described in the above-described embodiments can be used. The image signal is transmitted as RAW data to a camera control unit (CCU) 13135.

The CCU 13135 includes, for example, a central processing unit (CPU) and a graphics processing unit (GPU), and performs central control on operations of the endoscope 13100 and a display device 13136. Furthermore, the CCU 13135 receives an image signal from the camera head 13102, and performs, on the image signal, various types of image processing for displaying an image based on the image signal such as development processing (demosaicing) or the like.

The display device 13136 displays, under control performed by the CCU 13135, the image based on the image signal on which image processing is performed by the CCU 13135.

The light source device 13203 includes, for example, a light source such as a light-emitting diode (LED) and supplies, to the endoscope 13100, illumination light to be used when an image of a surgical target or the like is captured.

An input device 13137 is an input interface for the endoscopic operation system 13003. The user can input various types of information or commands to the endoscopic operation system 13003 through the input device 13137.

A treatment tool control device 13138 controls driving of an energy treatment tool 13112 for ablating or dissecting tissue, closing a blood vessel, or the like.

The light source device 13203 supplies, to the endoscope 13100, illumination light to be used when an image of a surgical target is captured. The light source device 13203 includes a white light source formed by, for example, an LED, a laser light source, or a combination of an LED and a laser light source. In a case where the white light source is formed by a combination of RGB laser light sources, the output intensity and the output timing of each color (each wavelength) can be controlled with high accuracy, and thus the white balance of a captured image can be adjusted by the light source device 13203. Moreover, in this case, an observation target is irradiated with laser light from each of the RGB laser light sources in a time division manner, and driving of an image sensor of the camera head 13102 is controlled in synchronization with the irradiation timing. As a result, images corresponding to R, G, and B in a respective manner can be captured in a time division manner. With the method, the image sensor can capture color images without being provided with color filters.

Driving of the light source device 13203 may be controlled such that the intensity of output light is changed every certain time period. Images are acquired in a time division manner by controlling driving of the image sensor of the camera head 13102 in synchronization with the timing at which the intensity of the light is changed, and the images are combined. As a result, high dynamic range images without so-called crushed shadows and blown highlights can be generated.

The light source device 13203 may also be configured to be able to supply light having a predetermined wavelength band corresponding to special light observation. In special light observation, for example, the wavelength dependence of light absorption in body tissue is used. Specifically, by performing irradiation with light of a narrower band than the illumination light used at the time of a normal observation (that is, white light), images of certain tissue such as a blood vessel in a mucosal surface layer can be captured with high contrast. Alternatively, in special light observation, fluorescence observation may be performed in which an image is obtained using fluorescence generated by excitation light irradiation. In fluorescence observation, for example, body tissue is irradiated with excitation light, and fluorescence from the body tissue can be observed. Alternatively, in fluorescence observation, a reagent such as indocyanine green (ICG) is locally injected to body tissue, and the body tissue is irradiated with excitation light corresponding to the fluorescence wavelength of the reagent, so that a fluorescence image can be obtained. The light source device 13203 may be configured to be able to supply at least one out of light of a narrow band and excitation light that correspond to such special light observation.

Thirteenth Embodiment

Figure 19A:
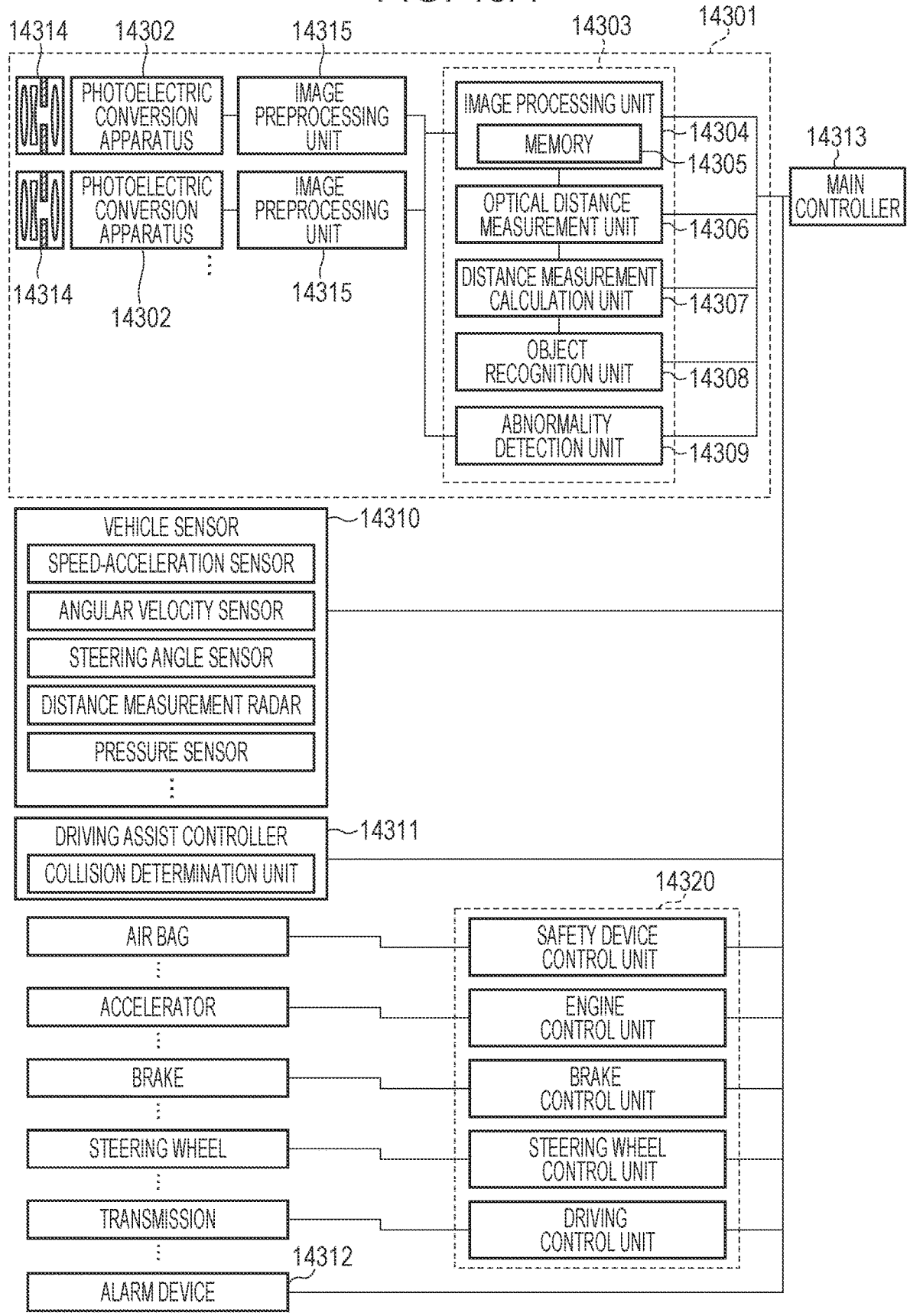

A photoelectric conversion system and a moving object according to the present embodiment will be described using FIGS. 19A and 19B. FIGS. 19A and 19B are schematic diagrams illustrating an example of the configuration of the photoelectric conversion system and an example of the configuration of the moving object according to the present embodiment. In the present embodiment, an example of a vehicle-mounted camera is illustrated as the photoelectric conversion system.

FIG. 19A illustrates an example of a vehicle system and an example of the photoelectric conversion system, which is mounted in the vehicle system and captures images. A photoelectric conversion system 14301 includes a photoelectric conversion apparatus 14302, an image preprocessing unit 14315, an integrated circuit 14303, and an optical system 14314. The optical system 14314 forms an optical image of a subject onto the photoelectric conversion apparatus 14302. The photoelectric conversion apparatus 14302 converts the optical image of the subject formed by the optical system 14314 into an electric signal. The photoelectric conversion apparatus 14302 is one of the photoelectric conversion apparatuses according to the above-described embodiments. The image preprocessing unit 14315 performs certain signal processing on the signal output from the photoelectric conversion apparatus 14302. The functions of the image preprocessing unit 14315 may be incorporated into the photoelectric conversion apparatus 14302. The photoelectric conversion system 14301 includes at least two groups each including the optical system 14314, the photoelectric conversion apparatus 14302, and the image preprocessing unit 14315. Outputs from the image preprocessing units 14315 of both groups are input to the integrated circuit 14303.

The integrated circuit 14303 is an integrated circuit for image capturing systems and includes an image processing unit 14304, an optical distance measurement unit 14306, a distance measurement calculation unit 14307, an object recognition unit 14308, and an abnormality detection unit 14309. The image processing unit 14304 includes a memory 14305. The image processing unit 14304 performs image processing such as development processing or defect correction on an output signal from the image preprocessing unit 14315. The memory 14305 is a primary storage for captured images and stores positions of defective pixels of the captured images. The optical distance measurement unit 14306 brings a subject into focus or measures a distance. The distance measurement calculation unit 14307 calculates distance measurement information from a plurality of pieces of image data acquired by the plurality of photoelectric conversion apparatuses 14302. The object recognition unit 14308 recognizes a subject such as a car, a road, a signpost, a person, or the like. When the abnormality detection unit 14309 detects an abnormality of one of the photoelectric conversion apparatuses 14302, the abnormality detection unit 14309 notifies a main controller 14313 of the abnormality.

The integrated circuit 14303 may be realized by a hardware device designed in a dedicated manner, by a software module, or by a combination of a hardware device and a software module. The integrated circuit 14303 may also be realized by, for example, a field-programmable gate array (FPGA) or an application-specific integrated circuit (ASIC) or may also be realized by a combination of an FPGA and an ASIC.

The main controller 14313 performs central control on operations of the photoelectric conversion system 14301, a vehicle sensor 14310, a control unit 14320, and so forth. Each of the photoelectric conversion system 14301, the vehicle sensor 14310, and the control unit 14320 may have a communication interface without provision of the main controller 14313. A method can also be used in which each of the photoelectric conversion system 14301, the vehicle sensor 14310, and the control unit 14320 performs transmission and reception through the communication network (for example, the CAN standard).

The integrated circuit 14303 has the function of transmitting a control signal or a setting value to the photoelectric conversion apparatuses 14302 upon receiving a control signal from the main controller 14313 or by using its controller.

The photoelectric conversion system 14301 is connected to the vehicle sensor 14310. The vehicle sensor 14310 can detect the driving state of the vehicle having the vehicle sensor 14310 such as a vehicle speed, a yaw rate, and a steering angle and detect the state of the external environment of the vehicle or the states of other cars and obstructions. The vehicle sensor 14310 also serves as a distance information acquisition unit configured to acquire information regarding the distance to a target object. The photoelectric conversion system 14301 is also connected to a driving assist controller 14311, which realizes various types of driving assistance functions such as automatic steering, automatic cruising, and collision avoidance. In particular, regarding a collision determination function, whether the vehicle is likely to collide with or has collided with another car or an obstruction is determined on the basis of a detection result from the photoelectric conversion system 14301 or the vehicle sensor 14310. As a result, collision avoidance control is performed in a case where a collision is likely to happen, or a safety device is activated at the time of collision.

The photoelectric conversion system 14301 is also connected to an alarm device 14312, which alerts the driver on the basis of a determination result from a collision determination unit included in the driving assist controller 14311. For example, in a case where the chances of a collision are high based on a determination result from the collision determination unit, the main controller 14313 performs vehicle control to avoid a collision or reduce damage by braking, releasing the accelerator, controlling the engine output, or the like.

The alarm device 14312 alerts the user by going off an alarm such as certain sound, displaying alarm information on the screen of a display unit of a car navigation system or a meter panel, or vibrating their seat belt or the steering wheel.

In the present embodiment, images around the vehicle, for example, images of views in front of or behind the vehicle are captured by the photoelectric conversion system 14301. FIG. 19B illustrates an example of the photoelectric conversion system 14301 arranged for a case where images of views in front of the vehicle are captured by the photoelectric conversion system 14301.

The two photoelectric conversion apparatuses 14302 are arranged at the front of a vehicle 14300. Specifically, a center line in the forward-backward direction of the vehicle 14300 or with respect to the outside shape of the vehicle 14300 (for example, the width of the vehicle) is treated as a symmetry axis, and the two photoelectric conversion apparatuses 14302 are arranged to have line symmetry with respect to the symmetry axis. This form is used in a case where information regarding the distance between the vehicle 14300 and a subject target is to be acquired or a case where a determination regarding the likelihood of a collision is to be made.

In one embodiment, the photoelectric conversion apparatuses 14302 are arranged so as not to block the driver's view when the driver checks the situation outside the vehicle 14300 from the driver's seat. And the alarm device 14312 are arranged such that the alarm device 14312 is likely to be in the driver's view.

In the present embodiment, control for preventing the vehicle from colliding with other vehicles has been described. However, the photoelectric conversion system 14301 can also be applied to perform, for example, control under which the vehicle drives autonomously so as to follow other vehicles or control under which the vehicle drives autonomously so as not to drive out of the lane. Furthermore, the photoelectric conversion system 14301 can be applied not only to vehicles such as the vehicle having the photoelectric conversion system 14301 but also to, for example, moving objects (moving apparatuses) such as vessels, airplanes, or industrial robots. In addition, the photoelectric conversion system 14301 can be applied not only to the moving objects but also to equipment used to recognize objects in a wide region such as an intelligent transportation system (ITS).

The photoelectric conversion apparatuses according to the aspect of the embodiments may be configured to be able to further acquire various types of information such as distance information.

Fourteenth Embodiment

Figure 20A:
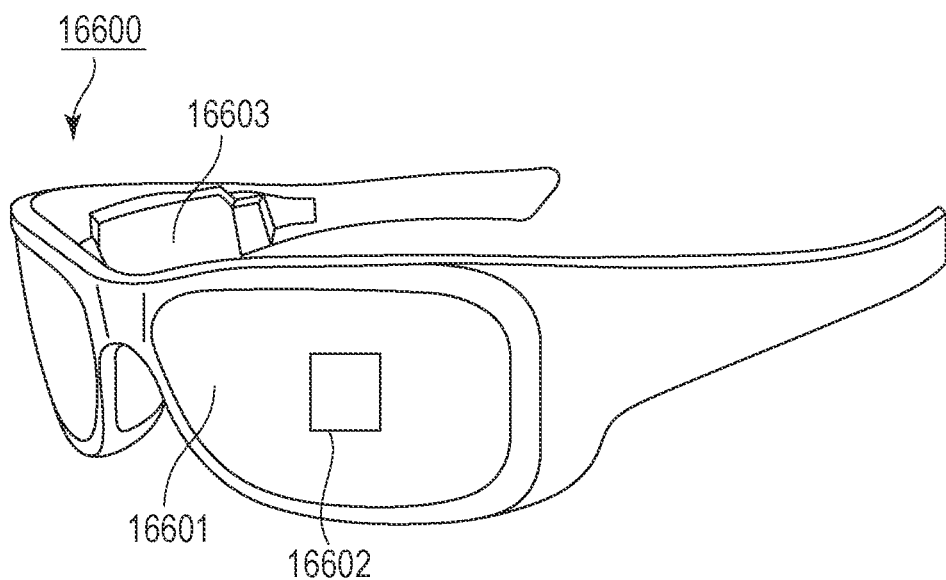
FIGS. 20A and 20B are schematic diagrams of smart glasses according to a fourteenth embodiment.

FIG. 20A illustrates glasses 16600 (smart glasses) according to one application. The glasses 16600 have a photoelectric conversion apparatus 16602. The photoelectric conversion apparatus 16602 is one of the photoelectric conversion apparatuses according to the above-described embodiments. A display device including a luminescent device such as an organic light-emitting diode (OLED) or an LED may be provided on the back side of a lens 16601. There may be one photoelectric conversion apparatus 16602 or more. Alternatively, a plurality of types of photoelectric conversion apparatuses may be combined and used. The photoelectric conversion apparatus 16602 does not have to be arranged at the position illustrated in FIG. 20A.

The glasses 16600 further have a control device 16603. The control device 16603 functions as a power source that supplies power to the photoelectric conversion apparatus 16602 and the display device described above. The control device 16603 controls the operation of the photoelectric conversion apparatus 16602 and the display device. In the lens 16601, an optical system is formed that concentrate light onto the photoelectric conversion apparatus 16602.

Figure 20B:
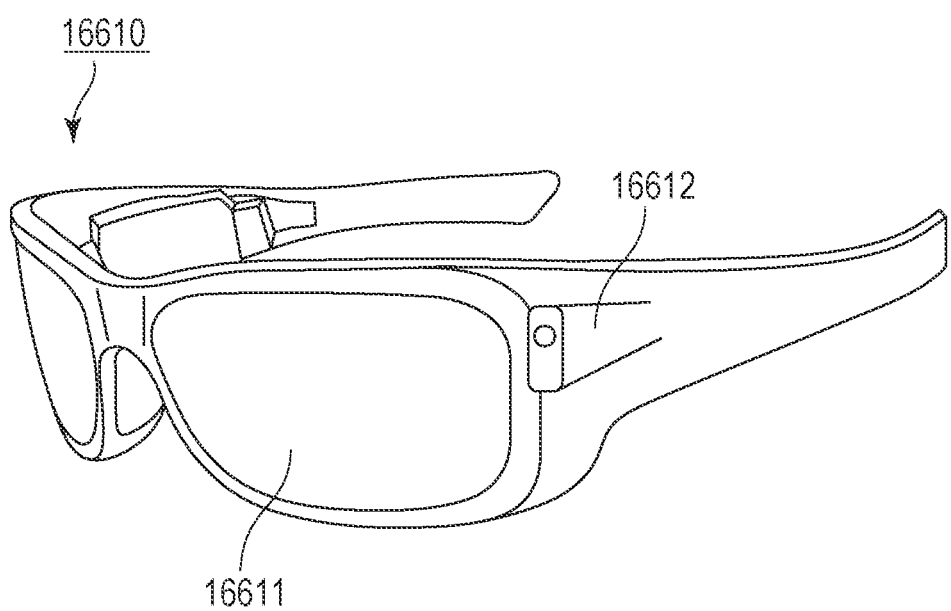

FIG. 20B illustrates glasses 16610 (smart glasses) according to one application.

The glasses 16610 have a control device 16612. The control device 16612 includes a photoelectric conversion apparatus corresponding to the photoelectric conversion apparatus 16602 and a display device. In a lens 16611, an optical system is formed that projects light emitted from the photoelectric conversion apparatus and the display device included in the control device 16612. An image is projected onto the lens 16611. The control device 16612 functions as a power source that supplies power to the photoelectric conversion apparatus and the display device, and controls the operation of the photoelectric conversion apparatus and the display device. The control device 16612 may have a line-of-sight detection unit configured to detect the line of sight of the wearer. Infrared rays may be used to detect the line of sight of the wearer. An infrared-emitting unit emits infrared light to an eyeball of the user gazing at a displayed image. An image of their eyeball is captured by an image capturing unit, which has a light reception element, detecting reflected light of the emitted infrared light from their eyeball. A decrease in the quality of images is reduced by provision of a reduction unit that reduces the amount of light from the infrared-emitting unit to a display unit in a plan view.

The line of sight of the user to the displayed image is detected from the image of their eyeball captured through image capturing using infrared light. A freely chosen known method can be applied to line-of-sight detection using a captured image of their eyeball. As an example, a line-of-sight detection method based on Purkinje images generated by reflected illumination light from the user's cornea can be used.

More specifically, line-of-sight detection processing based on a pupil-corneal reflection method is performed. The line of sight of the user is detected by calculating, using a pupil-corneal reflection method, a line-of-sight vector representing the orientation of their eyeball (a rotation angle) on the basis of an image of their pupil and Purkinje images included in a captured image of their eyeball.

The display device according to the present embodiment has a photoelectric conversion apparatus having a light reception element, and may control an image displayed on the display device on the basis of information regarding the user's line of sight from the photoelectric conversion apparatus.

Specifically, for the display device, a first line-of-sight region, at which the user gazes, and a second line-of-sight region other than the first line-of-sight region are determined on the basis of the line-of-sight information. The first line-of-sight region and the second line-of-sight region may be determined by the control device of the display device. Alternatively, the first line-of-sight region and the second line-of-sight region determined by an external control device may be received. In a display region of the display device, the display resolution of the first line-of-sight region may be controlled to be higher than that of the second line-of-sight region. That is, the resolution of the second line-of-sight region may be made lower than that of the first line-of-sight region.

The display region has a first display region and a second display region, which is different from the first display region. A prioritized region may be determined from among the first display region and the second display region on the basis of the line-of-sight information. The first display region and the second display region may be determined by the control device of the display device. Alternatively, the first display region and the second display region determined by an external control device may be received. The resolution of the prioritized region may be controlled to be higher than that of the region other than the prioritized region. That is, the resolution of the region having a relatively low priority may be reduced.

Note that artificial intelligence (AI) may be used to determine the first line-of-sight region or the prioritized region. AI may be a model configured to use an image of a user's eyeball and the direction in which their eyeball in the image actually sees as supervised data and to estimate the angle of the line of sight from an image of a user's eyeball and the distance to a target ahead of the line of sight. The display device, the photoelectric conversion apparatus, or an external device may have an AI program. In a case where an external device has the AI program, the angle of the line of sight of the user and the distance to the target are transferred to the display device through communication.

In a case where display control is performed on the basis of visual recognition and detection, the present embodiment can be applied to smart glasses further having a photoelectric conversion apparatus that captures an outside image. The smart glasses can display, in real time, outside information regarding a captured outside image.

Fifteenth Embodiment

A system according to the present embodiment will be described with reference to FIG. 21. The present embodiment can be applied to a pathological diagnosis system with which a doctor makes a diagnosis of a lesion by observing cells or tissue extracted from a patient or to a diagnosis support system that supports the pathological diagnosis system. The system according to the present embodiment may make a diagnosis of a lesion on the basis of an acquired image or may support making of a diagnosis.

Figure 21:
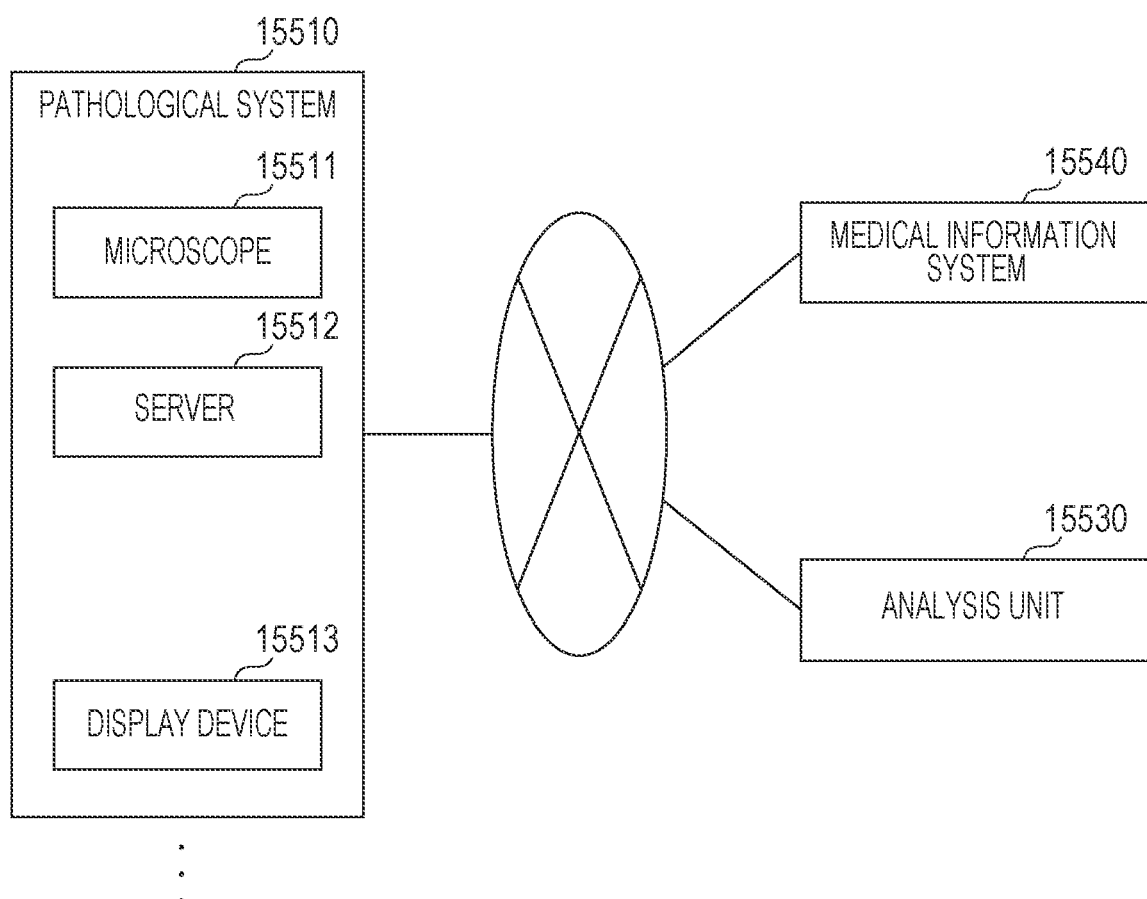
FIG. 21 is a functional block diagram of a diagnosis system according to a fifteenth embodiment.

As illustrated in FIG. 21, the system according to the present embodiment includes one or more pathological systems 15510. The system according to the present embodiment may further include an analysis unit 15530 and a medical information system 15540.

Each of the one or more pathological systems 15510 is a system mainly used by pathologists, and is installed in, for example, a research laboratory or a hospital. The pathological systems 15510 may be installed in different hospitals in a respective manner and are each connected to the analysis unit 15530 and the medical information system 15540 via various types of network such as a wide area network or a local area network.

Each pathological system 15510 includes a microscope 15511, a server 15512, and a display device 15513.

The microscope 15511 functions as an optical microscope. The microscope 15511 captures an image of an observation target placed between microscope glass slides to acquire a pathological image, which is a digital image. The observation target is, for example, tissue or cells extracted from a patient and may be a piece of tissue from one of their organs, saliva, blood, or the like.

The server 15512 records and stores pathological images acquired by the microscope 15511 into a storage unit that is not illustrated. In a case where a browsing request is accepted, the server 15512 retrieves pathological images stored in the memory or the like and can display the retrieved pathological images on the display device 15513. A device or the like that controls display may be interposed between the server 15512 and the display device 15513.

In this case, in a case where the observation target is a solid such as a piece of tissue from one of their organs, this observation target may be, for example, a colored thin section. The thin section may be produced, for example, by thinly slicing a block piece cut out from a sample such as one of their organs. To thinly slice the block piece, the block piece may be fixed using paraffin or the like.

The microscope 15511 may include a low resolution image capturing unit for capturing low resolution images and a high resolution image capturing unit for capturing high resolution images. The low resolution image capturing unit and the high resolution image capturing unit may use different optical systems or the same optical system. In a case where the low resolution image capturing unit and the high resolution image capturing unit use the same optical system, the microscope 15511 may be caused to change the resolution in accordance with an image capturing target.

An observation target is placed between microscope glass slides or the like, and is placed on the stage positioned within the angle of view of the microscope 15511. The microscope 15511 first acquires an overall image within the angle of view using the low resolution image capturing unit, and specifies an observation target region from the acquired overall image. Next, the microscope 15511 divides the region where the observation target is present into a plurality of division regions of a predetermined size, and acquires high resolution images of the division regions by sequentially capturing an image of each division region using the high resolution image capturing unit. When a target division region is switched, the stage may be moved, the imaging optical system may be moved, or both of the stage and the imaging optical system may be moved. Each division region may overlap adjacent division regions in order to prevent the occurrence of regions that are not subjected to image capturing due to unintentional slipping of the microscope glass slides. Furthermore, the overall image may include identification information used to associate the overall image with the patient. This identification information may be, for example, a character string or a Quick Response (QR) code (registered trademark).

High resolution images acquired by the microscope 15511 are input to the server 15512. The server 15512 can divide each high resolution image into partial images having a smaller size. In a case where the partial images are generated in this manner, the server 15512 performs composition processing, in which one image is generated by combining a predetermined number of partial images adjacent to each other, on every partial image. This composition processing may be repeated until one partial image is generated at last. Through such processing, a group of partial images having a pyramid structure is formed, the pyramid structure having layers each of which is formed by one or more partial images. In this pyramid structure, the number of pixels of each partial image in a layer is equal to that in another layer different from the layer; however, the resolutions are different from each other. For example, in a case where one partial image of an upper layer is generated by combining four partial images, which are (2×2) partial images, the resolution of the partial image of the upper layer is half that of the partial images of the lower layer used in composition.

By constructing a group of partial images having such a pyramid structure, it becomes possible to change the level of detail of the observation target displayed on the display device depending on the layer to which a tile image of a display target belongs. For example, in a case where a partial image of the lowest layer is used, a narrow region of the observation target is displayed in detail. A wider region of the observation target can be displayed with a lower resolution the nearer a partial image that is used is to the upper side The generated group of partial images having a pyramid structure can be stored in, for example, a memory or the like. In a case where the server 15512 receives a request for acquisition of a partial image including identification information from another apparatus (for example, the analysis unit 15530), the server 15512 transmits the partial image corresponding to the identification information to the other apparatus.

Note that a partial image, which is a pathological image, may be generated on an imaging condition basis such as a focal length basis or a coloring condition basis. In a case where a partial image is generated on an imaging condition basis, a specific pathological image and another pathological image corresponding to an imaging condition different from a specific imaging condition may be displayed next to each other, the specific pathological image and the other pathological image displaying the same region. The specific imaging condition may be specified by a viewer. In a case where a plurality of imaging conditions are specified by a viewer, pathological images corresponding to the individual imaging conditions and displaying the same region may be displayed next to each other.

The server 15512 may also store the group of partial images having a pyramid structure in a storage device other than the server 15512. Examples of the storage device include a cloud server. Furthermore, part of the entirety of partial image generation processing as described above may be executed by a cloud server or the like. By using partial images in this manner, the user can feel as if they are observing the observation target while changing the observation magnification. That is, by controlling display, the pathological system 15510 can be made to serve as a virtual microscope. A virtual observation magnification in this case actually corresponds to a resolution.

The medical information system 15540 is a so-called electronic medical record system, and stores information for identifying patients, information regarding disorders of the patients, examination information and image information used to make diagnoses, diagnosis results, and information regarding diagnoses such as prescriptions. For example, a pathological image obtained by capturing an image of an observation target of a certain patient is temporarily stored via the server 15512 and thereafter may be displayed on the display device 15513. A pathologist using one of the pathological systems 15510 makes pathological diagnoses on the basis of pathological images displayed on the display device 15513. The pathological diagnosis results made by the pathologist are stored in the medical information system 15540.

The analysis unit 15530 may analyze pathological images. To perform this analysis, a learning model generated through machine learning can be used. The analysis unit 15530 may output a classification result of a specific region, an identification result of tissue, or the like as its analysis result. Furthermore, the analysis unit 15530 may output, for example, identification results such as cell information, the number of cells, the positions of cells, or luminance information, or scoring information corresponding to these identification results. These pieces of information obtained from the analysis unit 15530 may be displayed, as diagnosis support information, on the display device 15513 of the pathological system 15510.

Note that the analysis unit 15530 may be a server system including one or more servers (including a cloud server). Moreover, the analysis unit 15530 may be incorporated in, for example, the server 15512 inside the pathological system 15510. That is, various types of analysis of pathological images may be performed inside the pathological system 15510.

The photoelectric conversion apparatuses described in the above-described embodiments can be applied to, for example, the microscope 15511 among the configurations described above. Specifically, the photoelectric conversion apparatuses described in the above-described embodiments can be applied to the low resolution image capturing unit, the high resolution image capturing unit, or both the low resolution image capturing unit and the high resolution image capturing unit in the microscope 15511. As a result, the low resolution image capturing unit, the high resolution image capturing unit, or both the low resolution image capturing unit and the high resolution image capturing unit can be reduced in size, which leads to size reduction of the microscope 15511. As a result, it becomes easier to transport the microscope 15511, and thus it becomes easier to install the microscope 15511 in a system, to perform a system rearrangement, or the like. Furthermore, by applying any one of the photoelectric conversion apparatuses described in the above-described embodiments, part or the entirety of processing from acquisition to analysis of a pathological image can be performed on the fly inside the microscope 15511. Thus, it becomes possible to output diagnosis support information more promptly and more accurately.

Note that the configurations described above can be applied not only to diagnosis support systems but also to general biological microscopes such as confocal microscopes, fluorescence microscopes, and video microscopes. In this case, an observation target may be a biological sample such as a cultured cell, a zygote, or a sperm, a biomaterial such as a cell sheet or three-dimensional cellular tissue, or a living body such as a zebrafish or a mouse. Moreover, the observation target can be observed not only in a state of being placed between microscope glass slides but also in a state of being stored in a microplate or a Petri dish.

Furthermore, a moving image may be generated from still images of the observation target acquired using a microscope. For example, a moving image may be generated from still images captured successively over a predetermined period, or an image sequence may be generated from still images captured at certain intervals. By generating a moving image from still images in this manner, dynamic characteristics of the observation target can be analyzed using machine learning. Examples of the dynamic characteristics include actions such as beating, elongating, or wandering of a cancer cell, a nerve cell, myocardial tissue, or a sperm and a splitting process of a cultured cell or a zygote.

OTHER EMBODIMENTS

As above, the embodiments have been described; however, the disclosure is not limited to these embodiments, and various changes and modifications may be made. In addition, the embodiments can be applied to each other. That is, part of one of the embodiments may be replaced with part of another one of the embodiments. Part of one of the embodiments may be added to part of another one of the embodiments. Furthermore, part of one of the embodiments may be deleted.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2021-016447, filed 4 Feb. 2021, which is hereby incorporated by reference herein in its entirety.

What is claimed is:

1. A photoelectric conversion apparatus comprising:
 a photoelectric conversion region provided with a plurality of photoelectric conversion units;
 a signal processing unit configured to process an output signal from the plurality of photoelectric conversion units;
 a processing unit configured to perform processing based on a learned model on data processed by the signal processing unit;
 a first pad or pads connected to the processing unit and configured to allow an input from and an output to an outside; and
 a second pad or pads connected to the signal processing unit, different from the first pad, and configured to allow an input from and an output to an outside,
 wherein the number of first pad or pads is different from that of second pad or pads.

2. The photoelectric conversion apparatus according to claim 1, wherein
 the photoelectric conversion apparatus includes the first pads and the second pads,
 each of the first pads is a pad configured to output data processed by the processing unit, and
 each of the second pads is a pad configured to output data processed by the signal processing unit.

3. The photoelectric conversion apparatus according to claim 2, further comprising:
 a memory configured to store the data processed by the processing unit and the data processed by the signal processing unit.

4. The photoelectric conversion apparatus according to claim 1, wherein
 the photoelectric conversion apparatus includes the first pads and the second pads,
 each of the first pads is a pad configured to supply a reference voltage to the processing unit, and
 each of the second pads is a pad configured to supply a reference voltage to the signal processing unit.

5. The photoelectric conversion apparatus according to claim 1,
 wherein the first pad and the second pad are not electrically connected to each other.

6. The photoelectric conversion apparatus according to claim 1, further comprising:
 a first substrate having the photoelectric conversion region; and
 a second substrate having at least one of the signal processing unit or the processing unit,
 wherein the first substrate and the second substrate are stacked one on top of one another.

7. The photoelectric conversion apparatus according to claim 6, wherein
 the second substrate is provided with one out of the signal processing unit and the processing unit, and
 the first substrate is provided with another one out of the signal processing unit and the processing unit.

8. The photoelectric conversion apparatus according to claim 1, wherein
 the photoelectric conversion apparatus has a plurality of sides in a plan view, and
 in a plan view, the first pad is provided at a first side, and the second pad is provided at a second side different from the first side.

9. The photoelectric conversion apparatus according to claim 8,
 wherein, in a plan view, a first distance, which is a shortest distance between the second side and the signal processing unit, is shorter than a second distance, which is a shortest distance between the first side and the signal processing unit.

10. The photoelectric conversion apparatus according to claim 8,
 wherein, in a plan, view, a third distance, which is a shortest distance between the first side and the processing unit, is shorter than a fourth distance, which is a shortest distance between the second side and the processing unit.

11. The photoelectric conversion apparatus according to claim 1, wherein
the photoelectric conversion apparatus has a plurality of sides in a plan view,
the processing unit has a first processing unit and a second processing unit,
the first pad connected to the first processing unit is provided at a first side, and
the first pad connected to the second processing unit is provided at a second side different from the first side.

12. The photoelectric conversion apparatus according to claim 1, further comprising:
a third pad connected to the processing unit,
wherein the third pad is a pad for inputting a signal to the processing unit.

13. The photoelectric conversion apparatus according to claim 12,
wherein the signal input from the third pad to the processing unit is a clock signal.

14. The photoelectric conversion apparatus according to claim 12,
wherein the signal input from the third pad to the processing unit is a signal output from an external engine provided outside the photoelectric conversion apparatus.

15. The photoelectric conversion apparatus according to claim 1,
wherein a resistance of a wiring line from the first pad to the processing unit is different from that of a wiring line from the second pad to the signal processing unit.

16. The photoelectric conversion apparatus according to claim 1,
wherein the first pad is different from the second pad in size in a plan view.

17. A photoelectric conversion system comprising:
the photoelectric conversion apparatus according to claim 1; and
a second signal processing unit configured to generate an image using a signal output from the photoelectric conversion apparatus.

18. A moving body provided with the photoelectric conversion apparatus according to claim 1,
the moving body comprising:
a controller configured to control movement of the moving body using a signal output from the photoelectric conversion apparatus.

19. A photoelectric conversion apparatus comprising:
a substrate including a photoelectric conversion region provided with a plurality of photoelectric conversion units;
a signal processing unit configured to perform digital signal processing an output digital signal from the plurality of photoelectric conversion units;
a processing unit configured to perform digital signal processing based on a learned model on data processed by the signal processing unit;
a first pad connected to the processing unit and configured to allow an input from and an output to an outside; and
a second pad connected to the signal processing unit, different from the first pad, and configured to allow an input from and an output to an outside,
wherein in a plan view, the first pad is arranged between a first side of the substrate and the photoelectric conversion region, wherein in the plan view, the second pad is arranged between a second side of the substrate and the photoelectric conversion region,
wherein a direction in which the first side extends and a direction in which the second side extends are different from each other, or
wherein the first side and the second side face each other.

20. The photoelectric conversion apparatus according to claim 19, wherein
the photoelectric conversion apparatus includes the first pads and the second pads,
each of the first pads is a pad configured to output data processed by the processing unit, and
each of the second pads is a pad configured to output data processed by the signal processing unit.

21. The photoelectric conversion apparatus according to claim 20, wherein
the photoelectric conversion apparatus includes the first pads and the second pads,
each of the first pads is a pad configured to supply a reference voltage to the processing unit, and
each of the second pads is a pad configured to supply a reference voltage to the signal processing unit.

22. The photoelectric conversion apparatus according to claim 19,
wherein the first pad and the second pad are not electrically connected to each other.

23. The photoelectric conversion apparatus according to claim 19, further comprising:
a first substrate having the photoelectric conversion region; and
a second substrate having at least one of the signal processing unit or the processing unit,
wherein the first substrate and the second substrate are stacked one on top of one another.

24. The photoelectric conversion apparatus according to claim 23,
wherein, in a plan view, a first distance, which is a shortest distance between the second side and the signal processing unit, is shorter than a second distance, which is a shortest distance between the first side and the signal processing unit.

25. The photoelectric conversion apparatus according to claim 24,
wherein, in a plan view, a third distance, which is a shortest distance between the first side and the processing unit, is shorter than a fourth distance, which is a shortest distance between the second side and the processing unit.

26. The photoelectric conversion apparatus according to claim 19,
wherein a resistance of a wiring line from the first pad to the processing unit is different from that of a wiring line from the second pad to the signal processing unit.

27. The photoelectric conversion apparatus according to claim 19,
wherein the first pad is different from the second pad in size in a plan view.

28. A photoelectric conversion system comprising:
the photoelectric conversion apparatus according to claim 19; and
a second signal processing unit configured to generate an image using a signal output from the photoelectric conversion apparatus.

29. A moving body provided with the photoelectric conversion apparatus according to claim 19,
the moving body comprising:

a controller configured to control movement of the moving body using a signal output from the photoelectric conversion apparatus.

30. The photoelectric conversion apparatus according to claim 19,
wherein the number of first pads is different from that of second pads.

\* \* \* \* \*